US012741341B2

(12) United States Patent
Richter et al.

(10) Patent No.: US 12,741,341 B2
(45) Date of Patent: Sep. 22, 2026

(54) METHOD FOR PRODUCING A DETACHMENT REGION IN A SOLID-STATE BODY

(71) Applicant: Siltectra GmbH, Dresden (DE)

(72) Inventors: Jan Richter, Dresden (DE); Christian Beyer, Freiberg (DE); Ralf Rieske, Dresden (DE)

(73) Assignee: Siltectra GmbH, Dresden (DE)

( * ) Notice: Subject to any disclaimer, the term of this patent is extended or adjusted under 35 U.S.C. 154(b) by 392 days.

(21) Appl. No.: 18/499,716

(22) Filed: Nov. 1, 2023

(65) Prior Publication Data

US 2024/0058899 A1 Feb. 22, 2024

Related U.S. Application Data

(63) Continuation of application No. 16/003,221, filed on Jun. 8, 2018, now Pat. No. 11,833,617, which is a (Continued)

(30) Foreign Application Priority Data

Nov. 27, 2014 (DE) ........................ 102014017582.0
Nov. 27, 2014 (DE) ........................ 102014017583.9
(Continued)

(51) Int. Cl.
*B23K 26/53* (2014.01)
*B23K 26/40* (2014.01)
(Continued)

(52) U.S. Cl.
CPC .............. *B23K 26/53* (2015.10); *B23K 26/40* (2013.01); *B23K 26/402* (2013.01);
(Continued)

(58) Field of Classification Search
None
See application file for complete search history.

(56) References Cited

U.S. PATENT DOCUMENTS 3,629,545 A 12/1971 Graham et al.
4,546,231 A 10/1985 Gresser et al.
(Continued)

FOREIGN PATENT DOCUMENTS

CN 102325717 A 1/2012
CN 102664221 A 9/2012
(Continued)

OTHER PUBLICATIONS

Editors of the American Heritage Dictionaries (Ed.). (2016). Density. In the American Heritage(R) Dictionary of the English Language (6th ed.). Houghton Mifflin., https://search.credoreference.com/articles/Qm9va0FydGljbGU6NDQwN DY2NA==?aid=279753, 2016, pp. 1-3.
(Continued)

*Primary Examiner* — Elizabeth M Kerr
(74) *Attorney, Agent, or Firm* — Murphy, Bilak & Homiller, PLLC

(57) ABSTRACT

A method for producing a detachment region in a solid-state body includes: providing a solid body that consists of a chemical compound comprising a combination of elements from the 3rd, 4th and 5th main group and subgroup 12 of the Periodic Table of the Elements; providing a laser light source; and exposing the solid body to laser beams from the laser light source. The laser beams penetrate into the solid body via a main surface of the solid body and are applied in a defined manner on a predefined portion of the solid body within the solid body to form a detachment region. The application of the laser beams successively creates multiple modifications in a crystal lattice of the solid body which, as a result of the modifications, fissures in a subcritical manner
(Continued)

at least in a portion in each case in regions that surround the modifications.

10 Claims, 23 Drawing Sheets

Related U.S. Application Data continuation of application No. 15/531,329, filed as application No. PCT/EP2015/077981 on Nov. 27, 2015, now Pat. No. 11,407,066.

(30) Foreign Application Priority Data

Dec. 17, 2014 (DE) ........................ 102014018720.9
Dec. 17, 2014 (DE) ........................ 102014018841.8
Jan. 15, 2015 (DE) ........................ 102015000449.2

(51) Int. Cl.
*B23K 26/402* (2014.01)
*B23K 103/00* (2006.01)
*B28D 5/00* (2006.01)
*H10P 52/00* (2026.01)
*H10P 54/00* (2026.01)
*H10P 90/00* (2026.01)

(52) U.S. Cl.
CPC ........... *B28D 5/0011* (2013.01); *H10P 52/00* (2026.01); *H10P 54/00* (2026.01); *H10P 90/126* (2026.01); *B23K 2103/50* (2018.08); *B23K 2103/56* (2018.08)

(56) References Cited

U.S. PATENT DOCUMENTS 5,374,564 A 12/1994 Bruel
5,714,306 A 2/1998 Komatsu et al.
5,756,061 A 5/1998 White
5,968,382 A 10/1999 Matsumoto et al.
5,968,383 A 10/1999 Yamazaki et al.
7,727,790 B2 6/2010 Zimmerman et al.
8,432,021 B2 4/2013 Moriwaka
8,466,074 B2 6/2013 Cho et al.
8,835,802 B2 9/2014 Baer
10,661,392 B2 5/2020 Beyer
11,014,199 B2 5/2021 Beyer
11,527,441 B2 12/2022 Beyer et al.
2002/0190435 A1 12/2002 Obrien et al.
2004/0171232 A1 9/2004 Cayrefourcq et al.
2004/0229444 A1 11/2004 Couillard et al.
2005/0048738 A1 3/2005 Shaheen et al.
2006/0240275 A1 10/2006 Gadkaree
2007/0298529 A1 12/2007 Maeda et al.
2009/0056513 A1 3/2009 Baer
2009/0302428 A1 12/2009 Sakamoto et al.
2010/0289189 A1 11/2010 Lichtensteiger et al.
2011/0132549 A1 6/2011 Sercel et al.
2011/0256736 A1 10/2011 Cho et al.
2012/0061356 A1 3/2012 Fukumitsu
2012/0255935 A1 10/2012 Kakui et al.
2013/0126573 A1 5/2013 Hosseini et al.
2013/0312460 A1* 11/2013 Kunishi ............ B23K 26/0665
65/112
2014/0001679 A1 1/2014 Okuma et al.
2014/0038392 A1 2/2014 Yonehara et al.
2014/0197419 A1 7/2014 Henley et al.
2014/0199519 A1 7/2014 Schillinger et al.
2016/0254232 A1 9/2016 Drescher et al.
2020/0051831 A1 2/2020 Beyer et al.
2020/0262008 A1 8/2020 Beyer

FOREIGN PATENT DOCUMENTS

CN 202655797 U 1/2013
CN 103380482 A 10/2013
CN 103380842 A 11/2013
CN 103459082 A 12/2013
CN 103703552 A 4/2014
DE 102010030358 A1 12/2011
DE 102013007672 A1 11/2014
DE 102013016682 A1 4/2015
DE 102014013107 A1 4/2015
EP 2346066 A1 7/2011
EP 2665090 A1 11/2013
EP 2754524 A1 7/2014
JP H0929472 A 2/1997
JP 2011152561 A 8/2011
JP 2011155069 A 8/2011
JP 2011240363 A 12/2011
JP 2012169361 A 9/2012
JP 2013046924 A 3/2013
JP 2013049161 A 3/2013
JP 2013141701 A 7/2013
JP 2013158778 A 8/2013
JP 2013161976 A 8/2013
JP 2015074004 A 4/2015
KR 20080010437 A 1/2008
KR 20100070159 A 6/2010
KR 20120047786 A 5/2012
KR 20130026809 A 3/2013
KR 20180059569 A1 6/2018
WO 2008033508 A2 3/2008
WO 2012074439 A2 6/2012
WO 2012108052 A1 8/2012
WO 2012108056 A1 8/2012
WO 2013009222 A1 1/2013
WO 2013115352 A1 8/2013
WO 2013115353 A1 8/2013
WO 2013126927 A2 8/2013
WO 2014156688 A1 10/2014
WO 2016083610 A2 6/2016

OTHER PUBLICATIONS

Zhao, X, et al., "Superhard and tougher SiC/diamond-like-carbon composite films produced by electron beam physical vapour deposition", Science Direct, Acta Mateiialia 51, 2009, 893-902.
"Heat Treatment Equipment", Professional Group of Shanghai Society of Mechanical Engineering, Shanghai Science and Technology, Jul. 31, 1963, pp. 1-27.

* cited by examiner

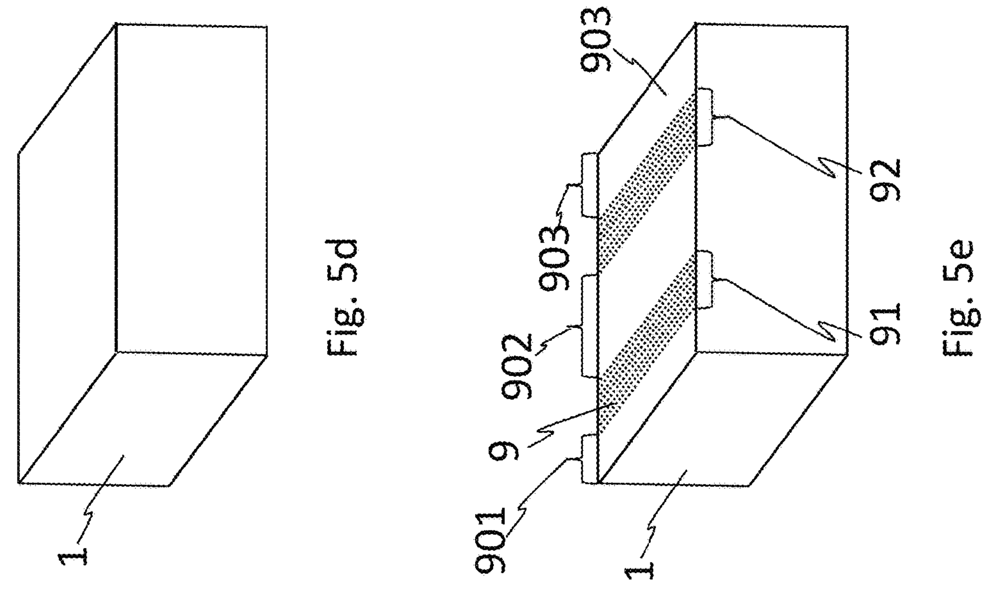
Fig. 5d
Fig. 5e
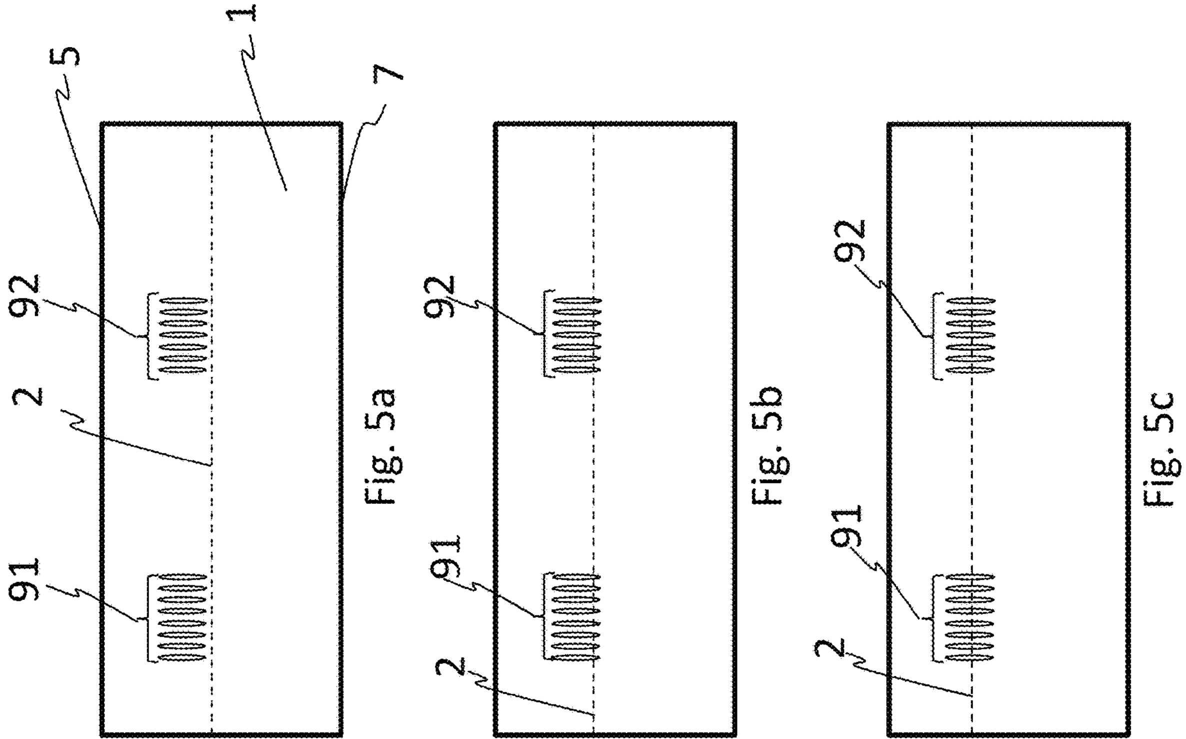
Fig. 5a
Fig. 5b
Fig. 5c 40
4
5
9
11
5
501

40
9
112
502
503

40
9
113
504
505

1
3
4
40
5
25
27
28
29
41
42
43
44
45
140
150
161

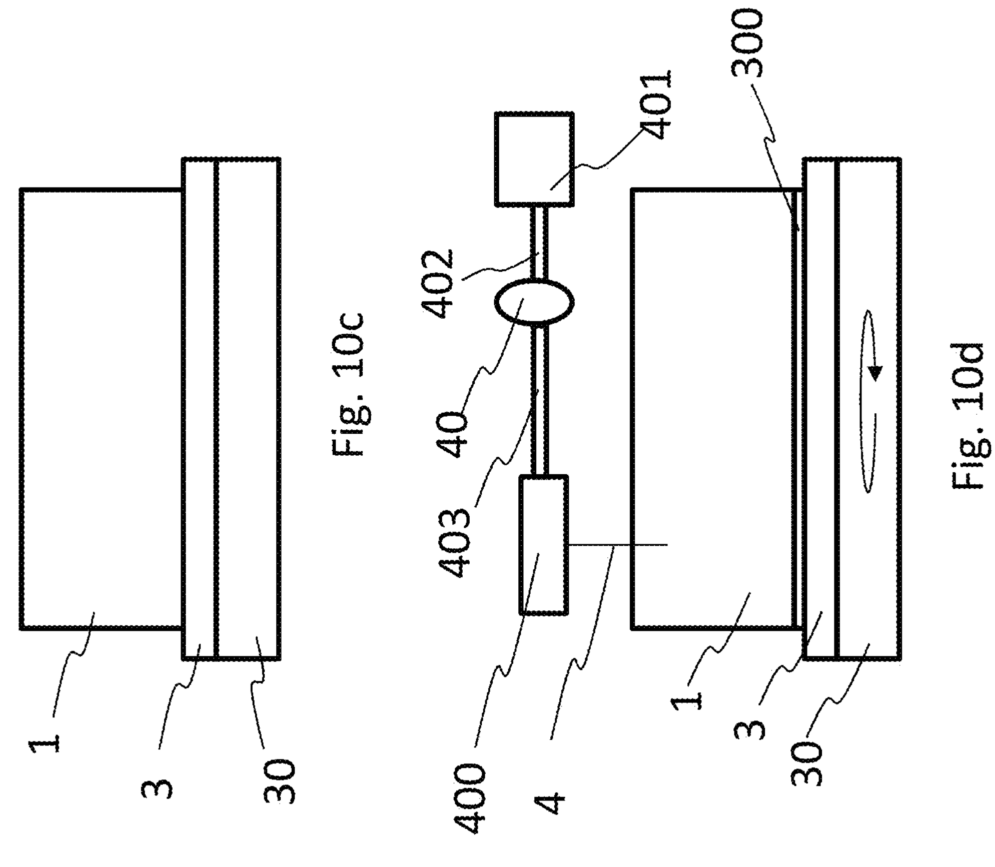
Fig. 10c
Fig. 10d
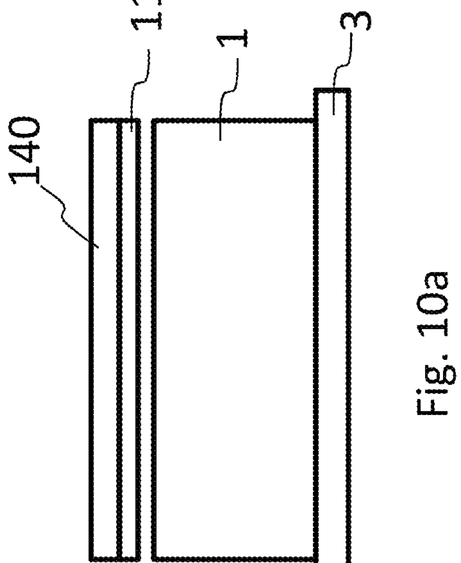
Fig. 10a
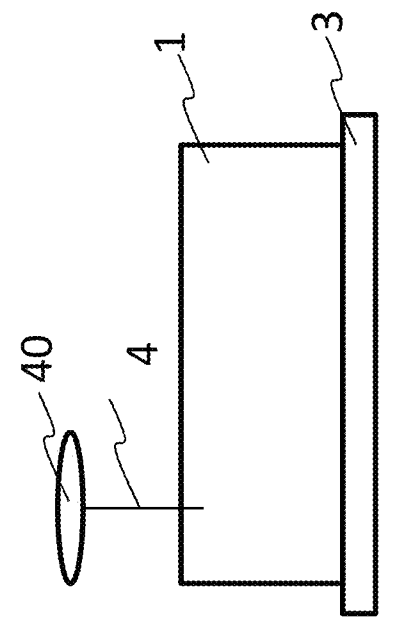
Fig. 10b 15
18
9
14
13
19
1
7
17
17
9
22
20

1
Z
9
2

9
23
Z
1
2

1
9
Z
2

9
23
Z
1
2

Z
9
2
1

9
23
Z
2
1

1
2
9

9
23
2

9
2
23

23
9
2

9
2
23

METHOD FOR PRODUCING A DETACHMENT REGION IN A SOLID-STATE BODY

TECHNICAL FIELD

The present invention relates to a method for creating a detachment zone in a solid in order to detach a solid portion from the solid and to a method for cutting off at least one solid portion from the solid.

BACKGROUND

The splitting of solids, in particular wafers, is classically achieved by sawing. However, this separation method has many disadvantages. During sawing, chips are always produced which therefore form disturbed base material. Furthermore, the thickness fluctuation of the sawn-off disks also increases with increasing sawing height. Furthermore, the saw element has the effect that grooves and surface damage are formed on the surfaces of disks to be separated from one another.

It is therefore apparent that the "sawing" separation method incurs very high material costs and costs for reworking.

The document WO 2013/126927 A2 further discloses a method for separation of device layers from an initial wafer. According to WO 2013/126927 A2 the entire arrangement undergoes very strong heating as a result of laser irradiation. This heating is required to achieve stresses inside the solid by means of the different coefficients of thermal expansion of the solid material and a "handler". It is apparent here that the thermal stressability of the "handler" must be very high here since very high temperatures occur. Furthermore, according to WO 2013/126927 A2 the laser beams are always introduced via a surface into the solid which is not part of the layer to be separated. This also results in a severe heating of the solid. The high temperatures also have the disadvantage that the solid distorts or expands involuntarily, with the result that crystal lattice modifications can only be produced very imprecisely.

According to WO 2013/126927 A2, therefore thick and large solids cannot be processed.

SUMMARY

It is therefore the object of the present invention to provide an alternative method for separating solid portions, in particular a plurality of solid layers, from a solid. The aforesaid object is solved according to the invention by a method for creating a detachment zone in a solid in order to detach a solid portion, in particular a solid layer, from the solid, wherein the solid portion to be detached is thinner than the solid from which the solid portion has been removed. This method preferably comprises according to the invention at least the steps: providing a solid to be processed, wherein the solid preferably consists of a chemical compound; providing a laser light source; subjecting the solid to laser radiation from the laser light source, wherein the laser beams penetrate into the solid via a surface of the solid portion to be cut off, wherein the laser radiation is applied in a defined manner to a predefined portion of the solid inside the solid to form a detachment zone or a plurality of partial detachment zones. Preferably the temperature produced in the predefined portion of the solid is so high that the material forming the predefined portion undergoes modification in the form of a predetermined material conversion, wherein the detachment zone is predefined or a plurality of partial detachment zones are predefined by the modifications. Additionally or alternatively, a plurality of modifications in the crystal lattice are successively produced by the applied laser radiation, wherein as a result of the modifications in the regions surrounding the modifications, the crystal lattice fissures at least in a portion thereof in each case, wherein the detachment zone or a plurality of partial detachment zones is or are predefined by the fissures in the detachment zone.

This solution is advantageous since a material conversion or phase conversion can preferably be brought about without a local destruction of the crystal lattice, with the result that a weakening or reduction in strength in the solid can be brought about in a very controlled manner.

The present invention further provides the possibility for the first time that a solid need not be shortened orthogonally to its longitudinal direction to be shortened but that it is acted upon by the laser in its longitudinal direction in such a manner that a solid layer is cut off. This method further has the advantage that the laser radiation need not penetrate into the solid over the entire radius of the solid but can be introduced into the solid via a layer preferably parallel to the separation layer or detachment layer. This is particularly appropriate in solids whose radius is greater than or equal to the thickness of the solid layer to be separated.

According to a further preferred embodiment of the present invention, the material conversion constitutes a decomposition of the chemical compound into several or into all the individual components or elements. This embodiment is advantageous since as a result of the specific decomposition of the chemical compound of the solid, the most suitable material combination for the separation of the solid portion can be adjusted in a defined manner.

According to the present description, a solid starting material is preferably understood as a monocrystalline, polycrystalline or amorphous material. Monocrystalline material having a strongly anisotropic structure is preferably suitable as a result of the highly anisotropic binding forces. The solid starting material preferably comprises a material or material combination from one of the main groups 3, 4, 5 and/or subgroup 12 of the Periodic Table of Elements, in particular a combination of elements from the 3rd, 4th and 5th main group and subgroup 12, such as, for example zinc oxide or cadmium telluride.

In addition to silicon carbide, the semiconductor starting material can for example consist of silicon, gallium arsenide AgAs, gallium nitride GaN, silicon carbide SiC, indium phosphide InP, zinc oxide ZnO, aluminium nitride AlN, germanium, gallium(III) oxide $Ga_2O_3$, aluminium oxide $Al_2O_3$ (sapphire), gallium phosphide GaP, indium arsenide InAs, indium nitride InN, aluminium arsenide AlAs or diamond.

The solid or the workpiece (e.g. wafer) preferably comprises a material or a material combination from one of the main groups 3, 4, 5 of the Periodic Table of Elements such as, for example, SiC, Si, SiGe, Ge, GaAs, InP, GaN, $Al_2O_3$ (sapphire), AlN. Particularly preferably the solid comprises a combination of elements coming from the third, fourth and fifth group of the Periodic Table of Elements. Feasible materials or material combinations are, for example, gallium arsenide, silicon, silicon carbide etc. Furthermore, the solid can comprise a ceramic (e.g. Al2O3-aluminium oxide) or consist of a ceramic, preferred ceramics in this case are for example perovskite ceramics (such as, for example, Pb-, O-, Ti/Zr-containing ceramics) in general and lead magnesium niobate, barium titanate, lithium titanate, yttrium aluminium garnet, in particular yttrium aluminium garnet crystals for solid-state laser applications, SAW ceramics (surface acoustic wave), such as for example lithium niobate, gallium orthophosphate, quartz, calcium titanate etc. in particular. The solid therefore particularly preferably comprises a semiconductor material or a ceramic material or the solid particularly preferably consists of at least one semiconductor material or a ceramic material. The solid is preferably an ingot or a wafer. The solid particularly preferably comprises a material which is at least partially transparent for laser radiation. It is therefore furthermore feasible that the solid comprises a transparent material or partially consists or is made of a transparent material such as for example sapphire. Other materials which come into consideration here as solid material alone or combined with another material are, for example "wide band gap" materials, InAlSb, high-temperature superconductors, in particular rare earth cuprates (e.g. $YBa_2Cu_3O_7$). It is additionally or alternatively feasible that the solid is a photomask, wherein preferably any photomask material known at the filing date and particularly preferably combinations thereof can be used as photomask material in the present case. Furthermore, the solid can additionally or alternatively comprise or consist of silicon carbide (SiC). The solid is preferably an ingot which in an initial state, i.e. in a state before separation of the first solid portion, preferably weighs more than 5 kg or more than 10 kg or more than 15 kg or more than 20 kg or more than 25 kg or more than 30 kg or more than 35 kg or more than 50 kg. The solid portion is preferably a solid layer, in particular a wafer having a diameter of at least 300 mm.

According to a further preferred embodiment of the present invention, the crystal lattice fissures at least for the most part in a portion spaced apart from the centre of the respective modification. This solution is particularly advantageous since this reduces the need for a reprocessing of the part of the solid on which less of the modification or of the modifications in terms of volume remains after separation.

According to a further preferred embodiment of the present invention, a conditioning of the modifications takes place, wherein the crystal lattice only fissures due to the conditioning in the regions surrounding the modifications at least in the respectively one portion.

Subcritical means here that the fissure propagation comes to rest or stops before the fissure splits the solid into at least two parts. Preferably a subcritical fissure propagates less than 5 mm, in particular less than 1 mm in the solid. The modifications are preferably produced in such a manner that for example during the separation of flat solid plates, the subcritical fissures preferably propagate for the most part in the same plane, in particular propagate in a plane parallel or directed in a defined manner to the surface of the solid through which the laser radiation penetrates into the solid. The modifications are preferably produced in such a manner that for example during the separate of uneven solids, the subcritical fissures preferably propagate in a defined manner, e.g. in a spherical position or layer in such a manner that the detachment zone has a defined, in particular spherical shape.

According to a further preferred embodiment of the present invention, for defined temperature control the laser radiation is introduced into the solid with a pulse density between 100 nJ/μm² and 10 000 nJ/μm², preferably between 200 nJ/μm² and 2000 nJ/μm² and particularly preferably between 500 nJ/μm² and 1000 nJ/μm².

According to a further preferred embodiment of the present invention, the receiving layer comprises or consists of a polymer or polymer material, wherein the polymer is preferably polydimethyl siloxane (PDMS) or an elastomer or an epoxy resin or a combination thereof.

According to a further preferred embodiment of the present invention, the energy of the laser beams of the laser, in particular an fs laser (femtosecond laser) is selected in such a manner that the material conversion in the solid or in the crystal in at least one direction is less than or greater than 30 times or 20 times or 10 times or 5 times or three times the Rayleigh length.

The wavelength of the laser beam of the laser, in particular the fs laser is, according to a further preferred embodiment of the present invention, selected in such a manner that the linear absorption of the solid or the material is less than 10 $cm^{-1}$, and preferably less than 1 $cm^{-1}$ and particularly preferably less than 0.1 $cm^{-1}$.

According to a further preferred embodiment of the present invention, the crystal lattice fissures at least for the most part in a portion spaced apart from the centre Z of the respective modification.

According to a further preferred embodiment of the present invention, the fissure runs at least in sections, through the majority of, in particular the entirety of the modifications or runs spaced apart from the majority of, in particular the entirety of the modifications.

According to a further preferred embodiment of the present invention, a first number of modifications is produced with its centre Z on one side of the detachment zone and a second number of modifications is produced with its centre on the other side of the detachment zone.

According to a further preferred embodiment of the present invention, the solid is connected via a solid surface to a cooling device, wherein the solid surface which is connected to the cooling device is configured to be parallel or substantially parallel to the surface via which the laser beams penetrate into the solid, wherein the cooling device is operated depending on the applied laser radiation, in particular depending on the temperature control of the solid resulting from the applied laser radiation. Particularly preferably the surface via which the solid is connected to the cooling device lies exactly opposite the surface via which the laser beams penetrate into the solid. This embodiment is advantageous since a temperature increase of the solid taking place during the production of modifications can be limited or reduced. Preferably the cooling device is operated in such a manner that the heat input introduced by the laser beams into the solid is removed from the solid by the cooling device. This is advantageous since the occurrence of thermally induced stresses or deformations can thereby be significantly reduced.

According to a further preferred embodiment of the present invention, the cooling device comprises at least one sensor device for detecting the temperature of the solid and brings about the cooling of the solid depending on a predefined temperature profile. This embodiment is advantageous since a temperature variation of the solid can be detected very precisely by the sensor device. Preferably the change in temperature is used as data input for actuating the cooling device.

According to a further preferred embodiment of the present invention, the cooling device is coupled to a rotational device and the cooling device with the solid arranged thereon is rotated by means of the rotational device during the production of the modification, in particular is rotated at more than 100 revolutions per minute or at more than 200 revolutions per minute or at more than 500 revolutions per minute.

According to a further preferred embodiment of the present invention, the number of modifications produced per $cm^2$ is different in at least two different regions of the solid, wherein in a first block, a first block of modification lines is produced, wherein the individual modifications per line are preferably spaced apart from one another by less than 10 μm, in particular less than 5 μm or less than 3 μm or less than 1 m or less than 0.5 μm, and the individual lines of the first block are produced spaced apart from one another by less than 20 μm, in particular less than 15 μm or less than 10 μm or less than 5 μm or less than 1 μm, wherein a first partial detachment zone is formed by the first block of modifications and a second block of modification lines is produced in a second region, wherein the individual modifications per line are produced spaced apart from one another by less than 10 μm, in particular less than 5 μm or less than 3 μm or less than 1 μm or less than 0.5 μm, and the individual lines of the second block are produced spaced apart from one another by less than 20 μm, in particular less than 15 μm or less than 10 μm or less than 5 μm or less than 1 μm, wherein a second partial detachment zone is formed by the second block of modifications, wherein the first region and the second region are spaced apart from one another by a third region, wherein in the third region none or substantially no modifications are produced by means of laser radiation and the first region is spaced apart from the second region by more than 20 μm, in particular more than 50 μm or more than 100 μm or more than 150 μm or more than 200 μm. This embodiment is advantageous since as a result of the local production of modification blocks, large mechanical stresses can be produced in the solid in such a manner that either a local fissuring of the solid can take place or as a result of a further triggering event, such as the thermal action on a receiving layer arranged on the solid, a fissure is produced in the solid. It was identified that the modification blocks have the effect that a fissure is guided stably in a region between two modification blocks. Thanks to the modification blocks, a controlled and very precise fissure propagation can be effected with fewer modifications. This has considerable advantages since the processing time is shortened, the energy consumption is reduced and the heating of the solid is reduced.

Preferably the modifications in the first block are produced in pulse intervals between 0.01 μm and 10 μm and/or line spacings between 0.01 μm and 20 μm are provided and/or a pulse repetition frequency between 16 kHz and 20 MHz is provided.

According to a further aspect of the present invention, depending on the location at which a modification is produced, an optical system by means of which the laser radiation is guided from a laser radiation source to the solid is adapted, which brings about at least one variation of the numerical aperture, wherein the numerical aperture at one location in the edge zone of the solid is smaller than at another location of the solid, which is closer to the centre of the solid. This embodiment is advantageous since modifications with different properties are produced. In particular in the edge zone, i.e. in the region up to 10 mm or up to 5 mm or up to 1 mm (in the radial direction) away from the edge, an optical system is preferably used which has a numerical aperture between 0.05 and 0.3, in particular of substantially or precisely 0.1. For the other regions, an optical system is preferably used in which the numerical aperture lies between 0.2 and 0.6, preferably between 0.3 and 0.5 and particularly preferably substantially or precisely 0.4.

According to a further preferred embodiment of the present invention, the thermal action on the receiving layer comprises a cooling of the receiving layer to a temperature of less than 20 °C, in particular less than 10 °C or less than 0 °C or less than −10 °C or less than 100 °C or to or below than the glass transition temperature of the material of the receiving layer.

As a result of the temperature control, modifications are produced or material conversion is produced by means of lasers, wherein pulse intervals between 0.01 μm and 10 μm, in particular 0.2 μm are provided and/or line spacings between 0.01 μm and 20 μm, in particular 3 μm, are provided and/or a pulse repetition frequency between 16 kHz and 20 MHz, in particular 128 kHz is provided and/or a pulse energy between 100 nJ and 2000 nJ, in particular 400 nJ is provided. Particularly preferably for the method according to the invention, in particular for acting upon silicon carbide, a pico- or femtosecond laser is used, wherein the laser preferably has a wavelength between 800 nm and 1200 nm, in particular of 1030 nm or 1060 nm. The pulse duration is preferably between 100 fs and 1000 fs, in particular 300 fs. Furthermore a lens is preferably used for focusing the laser beam, wherein the lens preferably brings about a 20-100 fold reduction, in particular a 50-fold reduction or focusing of the laser beam. Furthermore, the optical system for focusing the laser beam preferably has a numerical aperture of 0.1 to 0.9, in particular of 0.65.

Preferably each material conversion brought about by the laser radiation is a modification of the material of the solid, wherein the modifications can be understood additionally or alternatively for example as destruction of the crystal lattice of the solid. According to a further preferred embodiment of the present invention, the solid is moved, in particular displaced, in particular rotated with respect to the laser light source. Preferably the movement, in particular rotation of the solid with respect to the laser light source takes place continuously. The rotational speed occurring here preferably exceeds 1 revolution per second or 5 revolutions per second or 10 revolutions per second or a linear speed of at least 100 mm/s. The solid is preferably arranged on a rotary table or rotating chuck, in particular glued, for this purpose. The number of modification per $cm^2$ of the solid surface through which the laser radiation penetrates into the solid to produce the modifications lies below a predefined maximum number per rotation, wherein the maximum number of modifications per $cm^2$ and per rotation is preferably determined depending on the solid material and the energy density of the laser radiation and/or depending on the duration of the laser radiation pulses. Preferably a control device is provided which determines the maximum number of modifications to be produced per $cm^2$ per rotation depending on at least two or three or all of the aforesaid parameters and preferably other parameters, by means of predefined data and/or functions. This is particularly advantageous since it has been identified that harmful vertical fissure are formed if the damage density is too high, which results from stresses formed between the processed zones and the not-yet processed zones.

Additionally or alternatively in the case of successive rotations of the solid with respect to the laser light source the modifications are produced with different patterns, in particular distances between the individual newly produced modifications and/or with varied energy input, in particular reduced energy input. In particular, either the laser or the wafer or solid can be displaced in the XY direction, wherein the modifications are produced depending on the translational XY displacement. According to a preferred embodiment an XY table is used on which the solid is arranged during operation of the laser. Preferably the optical system by means of which the laser beams are deflected is adjusted or readjusted continuously or stepwise, in particular depending on a movement of the solid, in particular a rotation of the solid, by means of the already-mentioned control device or an alternative control device. Preferably as a result of the adjustment or readjustment, a second laser beam profile which differs from the first laser beam profile is adjusted compared with a first laser beam profile set before the adjustment or readjustment. Thus, different laser beam profiles are set depending on the rotation of the solid by the control device. Particularly preferably the laser scanning direction is adjusted or readjusted or varied in each case. Preferably the laser light source, the optical system, in particular the scanner and/or the device moving the solid, in particular the rotary table or rotating chuck, are additionally or alternatively actuated by the control device in such a manner that the energy input per rotation remains the same or decreases, wherein the energy input into the solid preferably decreases continuously, i.e. with each rotation or stepwise, i.e. after several rotations in each case. In the case of a stepwise decrease in the energy input, the number of rotations per step can differ from one another, so that a first step can for example comprise more than two rotations and another step can comprise more or less rotations that the first step. It is furthermore conceivable that the steps each comprise the same number of rotations. Furthermore the step method can also be mixed or combined with the continuous method.

According to a preferred embodiment, the laser beam can act upon a line several times with modifications so that an overall modification is produced in one line. According to a further alternative, the lines can cross or overlap under the action of the laser to form modifications, wherein the first line of modifications can intersect in particular at a predetermined angle of for example 90°, 45°, 30°, 600 or at another freely selectable angle. The angle of intersection between the lines of the laser action to produce modification can be oriented on the crystal alignment of the material of the solid in order to increase the effectiveness of the modifications produced.

Additionally or alternatively, the laser light source is configured as a scanner and the modifications are produced depending on the laser scanning direction, the laser polarization direction and the crystal orientation. Preferably the devices required to produce modifications, in particular the laser light source, the optical system in particular the scanner, and the device moving the solid, in particular the rotary table or rotating chuck are controlled by the aforesaid control device or an alternative control device depending on at least two or three of the aforesaid parameters and preferably other parameters, by means of predefined data and/or other functions.

Additionally or alternatively the distance between the centres of two modifications produced successively in the modification production direction or in the circumferential direction of the solid is less than 10 000 nm, in particular less than 1000 nm, in particular less than 100 nm.

Additionally or alternatively the outer boundaries of modifications produced successively in the modification production direction or in the circumferential direction of the solid are spaced apart from one another by less than 10 000 nm, in particular less than 1000 nm, in particular less than 100 nm.

The present invention further relates to a method for creating a detachment zone in a solid for detaching a solid portion from the solid, which comprises at least the steps mentioned hereinafter:

Providing a solid to be processed, providing a laser light source, subjecting the solid to laser radiation from a laser light source, wherein the laser radiation produces modifications, in particular crystal lattice defects in the solid, wherein a control device is provided for actuating the laser light source and/or a device moving the solid, in particular a rotary table or rotating chuck, and/or an optical system, in particular a scanner depending on individual or several specific parameters or as a function of individual or several of these parameters.

Preferably the solid is rotated with respect to the laser light source and the number of modifications per rotation per $cm^2$ of the solid surface through which the laser radiation penetrates into the solid to produce the modifications lies below a predefined maximum number, wherein the maximum number of modifications per $cm^2$ and per rotation is preferably determined depending on the solid material and the energy density of the laser radiation and/or in the case of successive rotations of the solid with respect to the laser light source, the modifications are produced with different patterns, in particular distances between the individual newly produced modifications and/or with varied energy input, in particular reduced energy input, and/or the laser light source is configured as a scanner and the modifications are produced depending on the laser scanning direction, the laser polarization direction and the crystal orientation, and/or the distance between the centres of two modifications produced successively in the modification production direction or in the circumferential direction of the solid is less than 10 000 nm, in particular less than 1000 nm, in particular less than 100 nm, and/or the outer boundaries of modifications produced successively in the modification production direction or in the circumferential direction of the solid are spaced apart from one another by less than 10 000 nm, in particular less than 1000 nm, in particular less than 100 nm.

Preferably the maximum possible number of modifications which can be produced in a travel cycle, in particular a rotation of the solid with respect to the optical system, in particular a scanner is determined by a plurality of parallel lines spaced apart from one another in particular in the radial direction and the maximum modifications which can be produced per line. According to a preferred embodiment, the laser beam can be split by a diffractive optical element into a plurality of laser beams in order to thus produce a corresponding number of modifications according to the splitting of the laser beam. Preferably the plurality of lines comprises at least two and preferably at least 10 and particularly preferably up to 50 or up to 100 or up to 200 lines. With regard to the pattern produced, it is feasible here that for a specific number of lines in a first travel cycle, for example, only every x-th line or every x-th and y-th line or every x-th and every x-th minus z line is provided with modifications. Specifically for example, every 5th line could be provided with modifications. Alternatively every 5th and every 7th line could be provided with modifications. Alternatively, for example, every 5th and every 5th minus 2 line can be provided with modifications which would then have the result that the 3rd, 5th, 8th, 10th, 13th, 15th etc. lines are provided with modifications. Furthermore it is also possible that these modifications are produced in blocks, that is that, for example that one block of 50 successive lines contains one modification and the following 50 lines contain no modifications, wherein this block of 50 lines without modification is again followed by a block of 50 lines with modification. This means that alternating blockwise modifications of a plurality of lines are provided. According to a further embodiment, the width of these alternating blocks can vary according to the distance from the edge of the sample, that is that, for example in the area of the edge, the blocks have a smaller number of lines of modifications and a higher number of lines of modifications towards the centre of the sample. Additionally or alternatively it is feasible that the distance between the lines in which modifications are produced varies depending on a function. In a second travel cycle which preferably occurs after the end of the first travel cycle, in particular after a first rotation, preferably alternative lines which are spaced apart from one another are described. In the second travel cycle and in the further travel cycles, other line numbers can then be provided for the variables x, y, z. Furthermore, more or less variables can be provided. Additionally or alternatively, the spacing between the individual modifications of a line can be produced according to a pattern. Preferably the modifications in one line are therefore produced in a first travel cycle, in particular a first rotation, e.g. only at every a-th position (at which a modification is provided) or at every a-th and b-th position or at every a-th and every a-th minus c position. Additionally or alternatively it is feasible that the spacing between the positions at which modifications are produced is varied depending on a function. In a second travel cycle which preferably occurs after the end of the first travel cycle, in particular after a first rotation, alternative positions which are preferably spaced apart from one another are described. In the second travel cycle and in the further travel cycles, other line numbers can then be provided for the variables a, b, c. Additionally or alternatively it is feasible that the lines which are processed are determined at least depending on a travel position or travel position, in particular a rotation position and the number of rotations and/or the positions in a line which are processed (or at which modifications are produced) are determined at least depending on a travel position or travel position, in particular a rotation position and the number of rotations. In particular in the case of linear travel paths of the solid or the optical system, lines or stiff sections of modifications inclined with respect to one another, in particular at right angles, can be produced.

According to a further preferred embodiment, each material conversion brought about by the laser radiation is a modification of the material of the solid, wherein the solid is moved translationally in the XY direction with respect to the laser source and the number of modifications per cm$^2$ of the solid surface through which the laser radiation penetrates into the solid to produce the modifications, wherein the maximum number of modifications per cm$^2$ and according to the translational movement in the XY direction is preferably determined depending on the solid material and the energy density of the laser radiation and/or according to the translational movement in the XY direction of the solid with respect to the laser light source, the modifications are produced with different patterns, in particular distances between the individual newly produced modifications and/or with varied energy input, in particular reduced energy input, and/or the laser light source is configured as a scanner and the modifications are produced depending on the laser scanning direction, the laser polarization direction and the crystal orientation, and/or the distance between the displacements of two modifications produced successively in the modification production direction is less than 10 000 nm, in particular less than 1000 nm, in particular less than 100 nm, and/or the outer boundaries of modifications produced successively in the modification production direction are spaced apart from one another by less than 10 000 nm, in particular less than 1000 nm, in particular less than 100 nm.

According to a further preferred embodiment, the laser radiation produces modifications, in particular crystal lattice defects in the solid, wherein the solid is moved translationally with respect to the laser source and the number of modifications per cm$^2$ of the solid surface through which the laser radiation penetrates into the solid to produce the modifications, wherein the maximum number of modifications per cm$^2$ and according to the translational movement in the XY direction is preferably determined depending on the solid material and the energy density of the laser radiation and/or according to the translational movement in the XY direction of the solid with respect to the laser light source, the modifications are produced with different patterns, in particular distances between the individual newly produced modifications and/or with varied energy input, in particular reduced energy input, and/or the laser light source is configured as a scanner and the modifications are produced depending on the laser scanning direction, the laser polarization direction and the crystal orientation, and/or the distance between the displacements of two modifications produced successively in the modification production direction is less than 10 000 nm, in particular less than 1000 nm, in particular less than 100 nm, and/or the outer boundaries of modifications produced successively in the modification production direction are spaced apart from one another by less than 10 000 nm, in particular less than 1000 nm, in particular less than 100 nm.

The control unit controls the generation of modifications for example depending on the number of travel cycles and/or the local heat evolution which is preferably detected optically and/or by means of sensors and/or the material properties, in particular the density and/or the strength and/or the thermal conductivity of the solid. The invention further relates to a method for separating at least one solid portion from a solid, in particular a wafer, at least comprising the steps: arranging a receiving layer on a treated solid, thermal action on the receiving layer in order to in particular mechanically produce fissure propagation stresses in the solid, wherein as a result of the fissure propagation stresses a fissure propagates in the solid along the detachment zone.

The said object is preferably also solved according to the invention by the method specified hereinafter. The method according to the invention for separating at least one solid portion from a solid, in particular a wafer, comprises at least the steps of modifying the crystal lattice of the solid by means of a modifying means, in particular a laser, in particular a pico- or femtosecond laser, wherein a plurality of modifications are produced in the crystal lattice, wherein as a result of the modifications, the crystal lattice fissures in the region surrounding the modifications, at least in respectively one portion, wherein a detachment zone is predefined by the fissures in the region of the modifications, arranging a receiving layer on the solid to hold the solid portion, thermally acting on the receiving layer, to produce stresses in the solid, in particular mechanically, wherein a main fissure is triggered by the stresses in the solid along the detachment zone, wherein the main fissure preferably separates the solid portion from the solid.

The present invention is further solved by a method for separating at least one solid portion from a solid, in particular a wafer. The method comprises at least the steps: modifying the crystal lattice of the solid by means of a modifying means, in particular a laser, in particular a pico- or femtosecond laser, wherein a plurality of modifications are produced in the crystal lattice, wherein as a result of the modifications, fissure guiding stresses are produced in the crystal lattice in respectively at least one solid region surrounding a modification in such a manner that a fissure separating the solid is guided by the fissure guiding stresses, in particular offset with respect to the centre of the respective modification, wherein a detachment zone is predefined by the fissure guiding stresses in the solid portion of the modifications, arranging a receiving layer on the solid to hold the solid portion, thermally acting on the receiving layer, to produce stresses in the solid, in particular mechanically, wherein a fissure propagates in the solid along the detachment zone as a result of the fissure guiding stresses.

Further advantages, aims and properties of the present invention are explained with reference to the drawings appended to the following description in which the separation method according to the invention is shown. Components and elements which are preferably used in the method according to the invention and/or which agree at least substantially with regard to their function in the figures, can hereby be characterized with the same reference numbers, wherein these components or elements need not be numbered or explained in the figures.

BRIEF DESCRIPTION OF THE DRAWINGS

In the figures:

FIGS. 5*a*-5*c* shows three schematic cross-sectional views which each shown modification blocks in a solid;

FIGS. 5*d*-5*e* show two schematic views of solids split along the detachment zones, wherein the view according to FIG. 5*d* shows no modification residue and the view according to FIG. 5*e* shows modification residue;

FIG. 10*a* shows a schematic view of the state after separation of the solid portion;

FIG. 10*b* shows another laser application to the residual solid to produce modifications to separate another solid layer;

FIG. 10*c* shows a schematic view of the residual solid arranged on a cooling device, wherein the cooling device is arranged on a travel device, in particular a rotary table;

FIG. 10*d* shows a schematic view to produce modifications in the solid;

DETAILED DESCRIPTION

Figure 1:
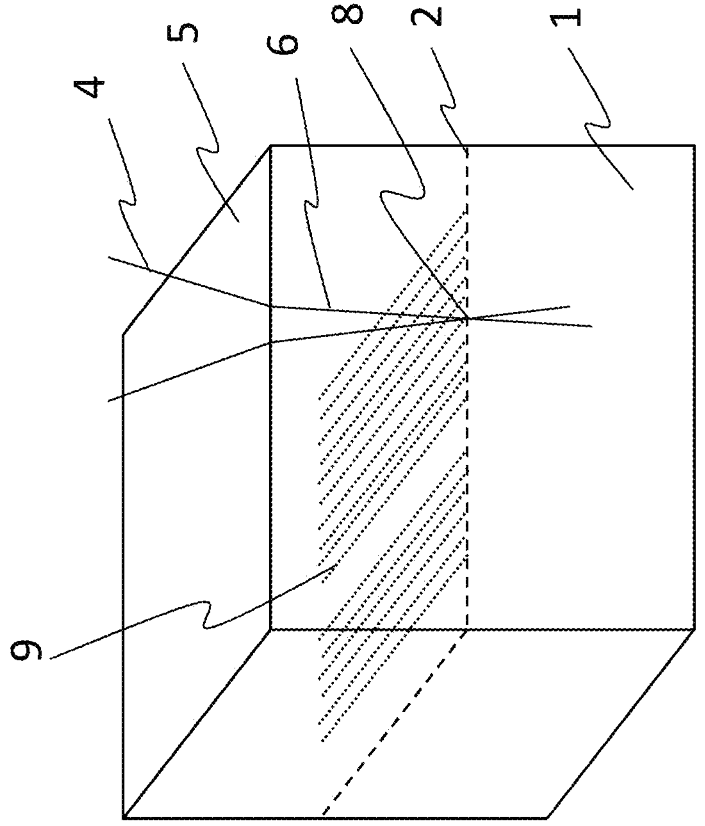
FIG. 1 shows a schematic view of the laser-based production of a detachment layer according to the invention in a solid.

The reference number 1 in FIG. 1 characterizes the solid, In the solid 1, modifications 9 according to the invention are produced to form a detachment zone 2 at which or along which the solid 1 is separated into at least two components. The modifications 9 are material conversions or phase conversions of the solid material through which the detachment zone 2 is created. The modifications 9 are produced by at least one laser beam 4. The laser beam 4 penetrates via a preferably treated, in particular polished surface 5 into the preferably at least partially transparent solid 1. At the surface 5 the at least one laser beam is preferably diffracted, which is characterized by the reference number 6. The at least one laser beam then forms a focus 8 for producing the modification. The polished surface 5 can also be designated as main surface 18.

Figure 2:
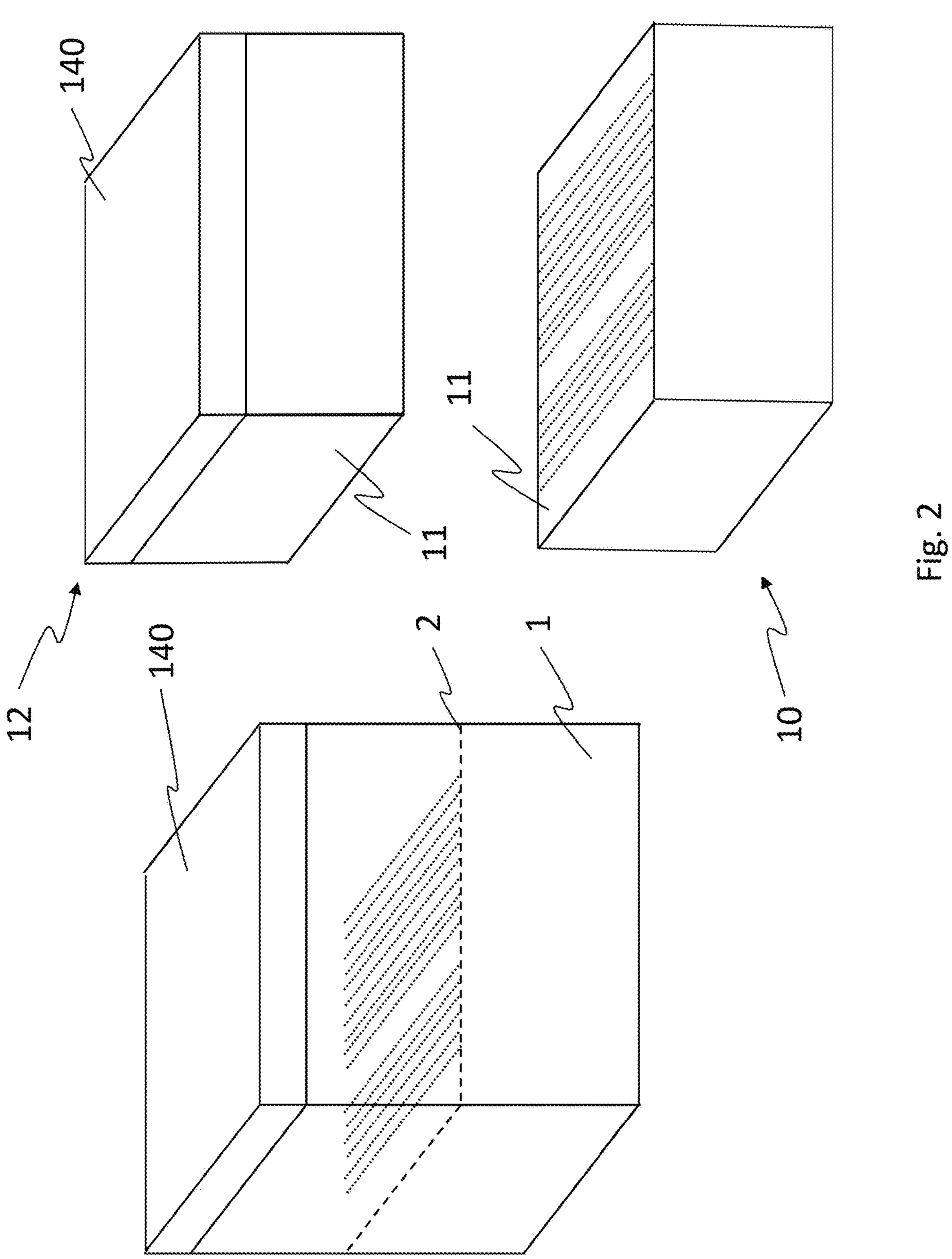
FIG. 2 shows a schematic view of a preferred separation process to separate a solid layer from a solid.

FIG. 2 also shows the treated solid 1 wherein on at least one surface of the solid 1, in particular partially or completely covering or overlapping the surface 5, a receiving layer 140 is provided, in particular is applied or produced, for introducing stresses into the solid 1. After splitting of the solid layer or the solid portion from the solid 1, the receiving layer 140 initially remains on the split solid portion and thus serves to receive this. The receiving layer 140 preferably consists of a polymer material or comprises a polymer material, in particular PDMS. As a result of temperature control, in particular cooling, of the receiving layer 140, the receiving layer 140 contracts and thereby introduces stresses into the solid 1 by means of which a fissure is triggered and produced and/or guided for separation of the solid portion from the solid 1.

The laser irradiation of the solid 1 particularly preferably forms a local temperature control of the solid 1, in particular inside the solid 1. As a result of the temperature control, the chemical binding of the solid material changes, which results in a variation, in particular reduction, in the strength or stability of the solid 1 in the irradiated portion. The laser irradiation preferably takes place in the entire plane penetrating the solid 1, wherein it is also feasible that at least or a maximum of 30% or 50% or 60% or 70% or 80% or 90% of the plane penetrating the solid 1 undergoes the modification according to the invention.

The reference number 10 characterizes a first solid portion after cutting through the solid 1 and the reference number 12 characterizes the second solid portion after cutting through the solid 1. The reference number 11 further characterizes the surfaces along which the two solid portions 10, 12 are separated from one another.

Figure 3:
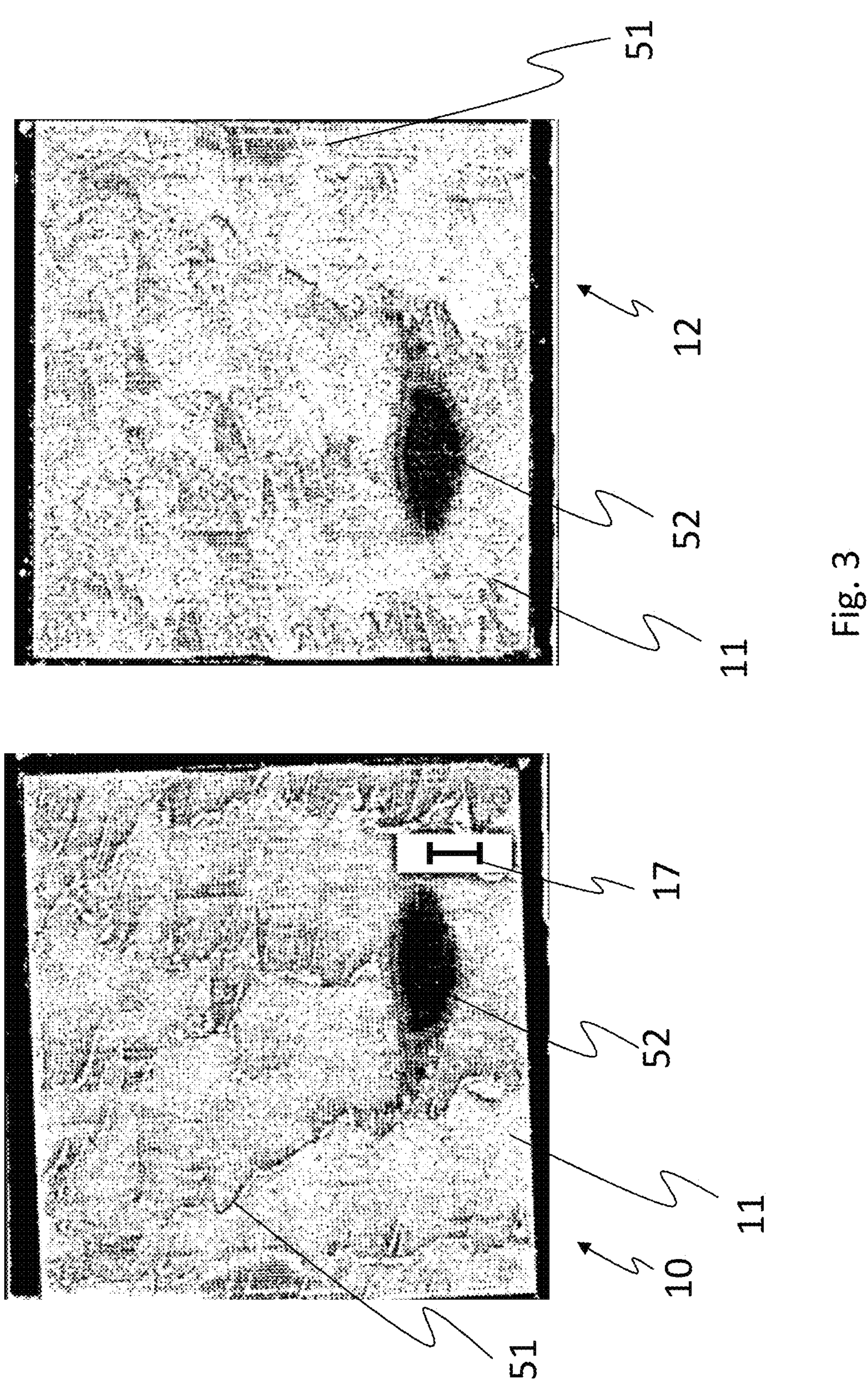
FIG. 3 shows two microscope views of the surfaces formed along the detachment zone of separated solid portions.

FIG. 3 shows a surface 11 of a first solid portion 10 and a second solid portion 12, wherein the first solid portion 10 and the second solid portion 12 have been separated from one another along the surfaces 11. FIG. 3 further shows an untreated region 51 or untreated portion of the solid 1 and a treated region 52 or treated portion of the solid 1. The treated portion 52 has been formed by laser irradiation according to the invention and shows that the material of the solid 1 has changed or has been converted in this region.

Figure 4:
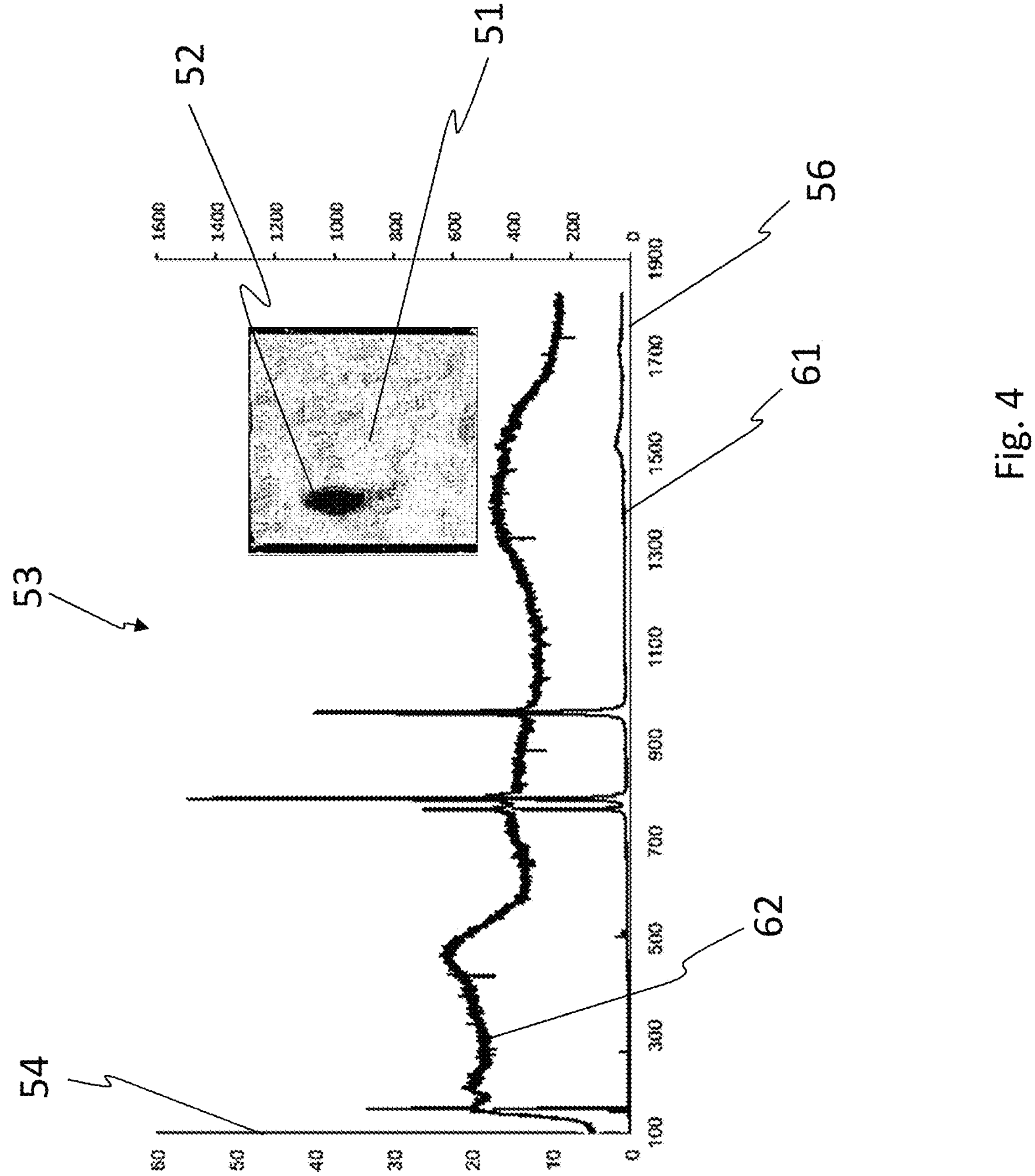
FIG. 4 shows a view to demonstrate the effect according to the invention.

FIG. 4 shows a Raman spectrum (reference number 53) 6H-SiC with conditioning 1B after separation of the solid portion 12. The reference number 54 characterizes the intensity in % and the reference number 56 characterizes the wave number in $cm^{-1}$. The reference number 61 further characterizes the graph for the untreated material portion characterized by the reference number 51 in FIG. 3 and the reference number 62 characterizes the graph for the treated material portion characterized by the reference number 52 in FIG. 3. It can be deduced from the Raman spectrum 53 that the material portions characterized by the reference numbers 51 and 52 have different material properties, in particular are different substances.

The laser irradiation according to the invention brings about a substance-specific spatially resolved cumulation of the energy input, which results in a defined temperature control of the solid 1 at a defined location or at defined locations and in a defined time. In a specific application, the solid 1 can consist of silicon carbide, with the result that preferably a highly locally limited temperature control of the solid 1 to a temperature of, for example, more than 2830+/−40 °C is performed. This temperature control results in new substances or phases, in particular crystalline and/or amorphous phases, wherein the resulting phases are preferably Si (silicon) and DLC (diamond-like carbon) phases which are formed with significantly reduced strength. The detachment zone 2 is then obtained as a result of this reduced-strength layer. The laser is preferably regulated by spatially resolved sample temperature measurement to avoid edge effects in the solid or wafer processing.

FIG. 5*a* shows that in at least two different regions of the solid 1 the number of modifications produced per $cm^2$ is different. In a first region a first block 91 of modification lines is produced, wherein the individual modifications 9 per line are preferably produced spaced apart from one another by less than 10 μm, in particular less than 5 μm or less than 3 μm or less than 1 μm or less than 0.5 μm. The individual lines of the first modification block 91 are preferably produced spaced apart from one another by less than 20 μm, in particular less than 15 μm or less than 10 μm or less than 5 μm or less than 1 μm. Mechanical stresses in the solid 1 are produced by the first block 91 of modifications 91.

A second block 92 of modification lines is produced in a second region, wherein the individual modifications 9 per line are produced spaced apart from one another by less than 10 μm, in particular less than 5 μm or less than 3 μm or less than 1 μm or less than 0.5 μm. The individual lines of the second block 92 are preferably produced spaced apart from one another by less than 20 μm, in particular less than 15 μm or less than 10 μm or less than 5 μm or less than 1 μm. Mechanical stresses in the solid 1 are produced by the second block 92 of modifications 92.

The first region and the second region are spaced apart from one another by a third region, wherein in the third region none or substantially no modifications are produced by means of laser radiation and the first region is spaced apart from the second region by more than 20 μm, in particular more than 50 μm or more than 100 μm or more than 150 μm or more than 200 μm.

The modifications 9 are in this case preferably introduced into the solid 1 via a surface 5 of the subsequent solid layer 12. The distance between the surface 5 via which the laser beams are introduced and the modifications 9 is preferably shorter than the distance from the modifications 9 to another surface 7 of the solid 1 spaced apart from and preferably aligned parallel to the surface 5.

It is apparent that the detachment zone 2 according to this diagram on the one hand lies in particular in the longitudinal direction of the solid, below or above all the modifications 9 and is preferably spaced apart from the modifications 9.

FIG. 5*b* shows a similar basic structure. According to FIG. 5*b* however the detachment zone 2 extends through the modifications 9.

FIG. 5*c* further shows that the detachment zone 2 can also run through the centre of the modifications 9.

The course of the detachment zone 2 is in this case adjustable for example by means of the number of modifications 9 and/or the size of the modifications 9 and/or the spacing of the individual modifications 9 of a block 91, 92.

FIG. 5*d* shows the residual solid 1 after separation of the solid layer 12 along the detachment zone 2 shown in FIG. 5*a*. Since in this case the modifications 9 are completely removed from the residual solid 1, the residual solid 1 shows no residue of these modifications 9.

Residues of the modifications 9 can be seen from FIG. 5*e* however. These modification residues are obtained if the solid 1 is separated along one of the detachment zones 2 shown in FIG. 5*b* or 5*c*. It can further be identified that the modification blocks 91, 92 are preferably spaced apart from one another by fields 901, 902, 903 without modifications or with fewer modifications per $cm^2$. The fields without modifications 9 or with fewer modifications 9 can in this case preferably be smaller or larger than the region in which the modification blocks 91, 92 are produced. Preferably at least one, several or most of the regions in which the modification blocks 91, 92 are produced are multiple times, in particular at least 1.1 times, or 1.5 times or 1.8 times or 2 times or 2.5 times or 3 times or 4 times larger than the regions in which no modifications 9 or few modifications 9 are produced.

Figures 6A, 6B, 6C:
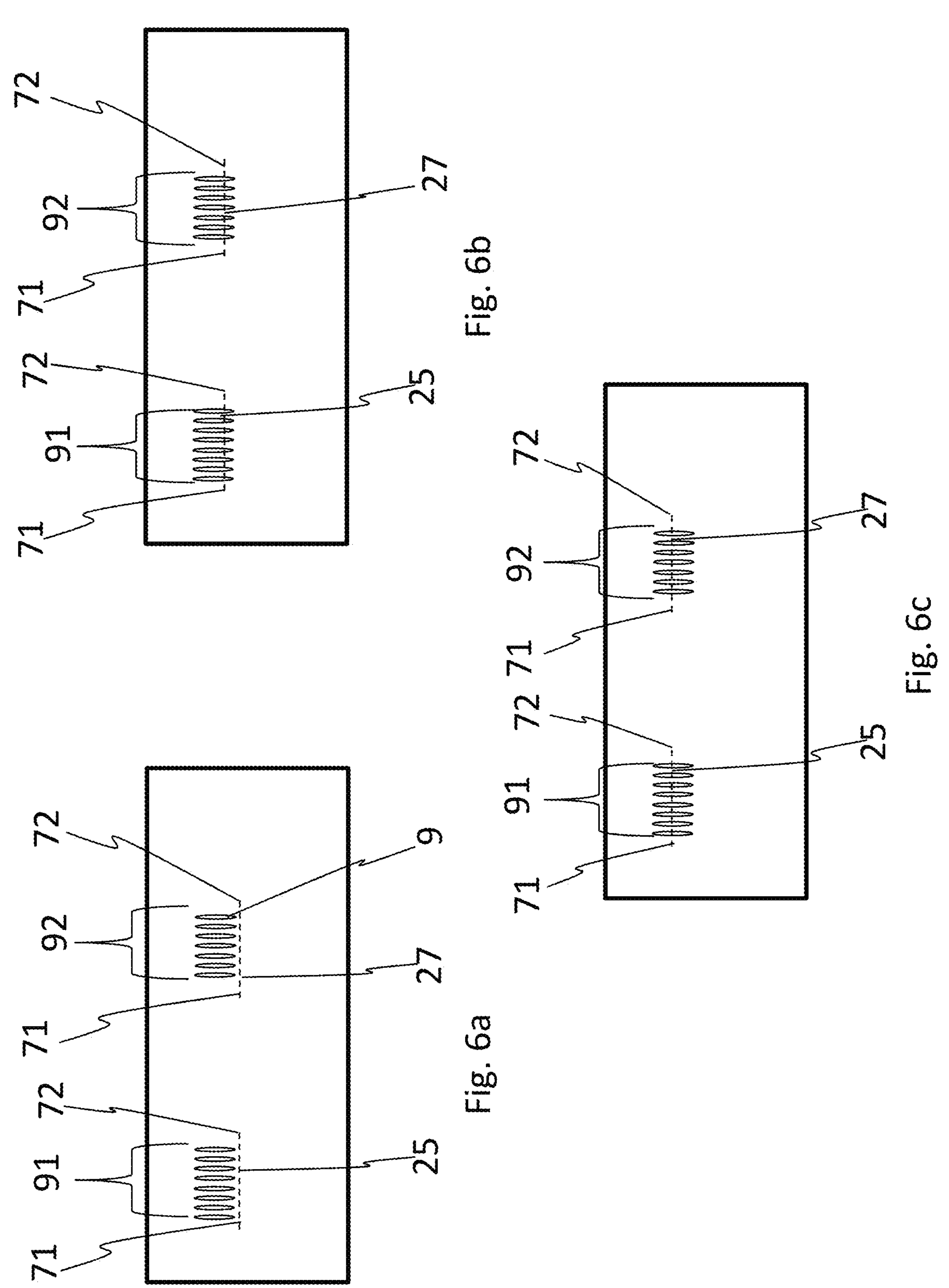
FIGS. 6*a-c* show three schematic views of modification blocks and the local solid weakenings or local solid incipient fissure produced thereby.

FIGS. 6*a*-6*c* show another embodiment of the present invention. According to these diagrams, the modification blocks 91, 92 are used to produce local material weakenings or local solid incipient fissures or local increases in stress. The reference number 25 here characterizes a first partial detachment zone or fissure portion in which the local material weakenings or local solid incipient fissures or local increases in stress occur and the reference number 27 here characterizes a second partial detachment zone or fissure portion in which the local material weakenings or local solid incipient fissures or local increases in stress occur. The individual partial detachment zones or fissure portions preferably form ends 71, 72 beyond which the respective partial detachment zone or fissure portion can be enlarged. The partial detachment zones or fissure portions are preferably enlarged as a result of an introduction of force accomplished by means of the receiving layer 140 (cf. FIG. 2).

Figures 7A, 7B, 7C:
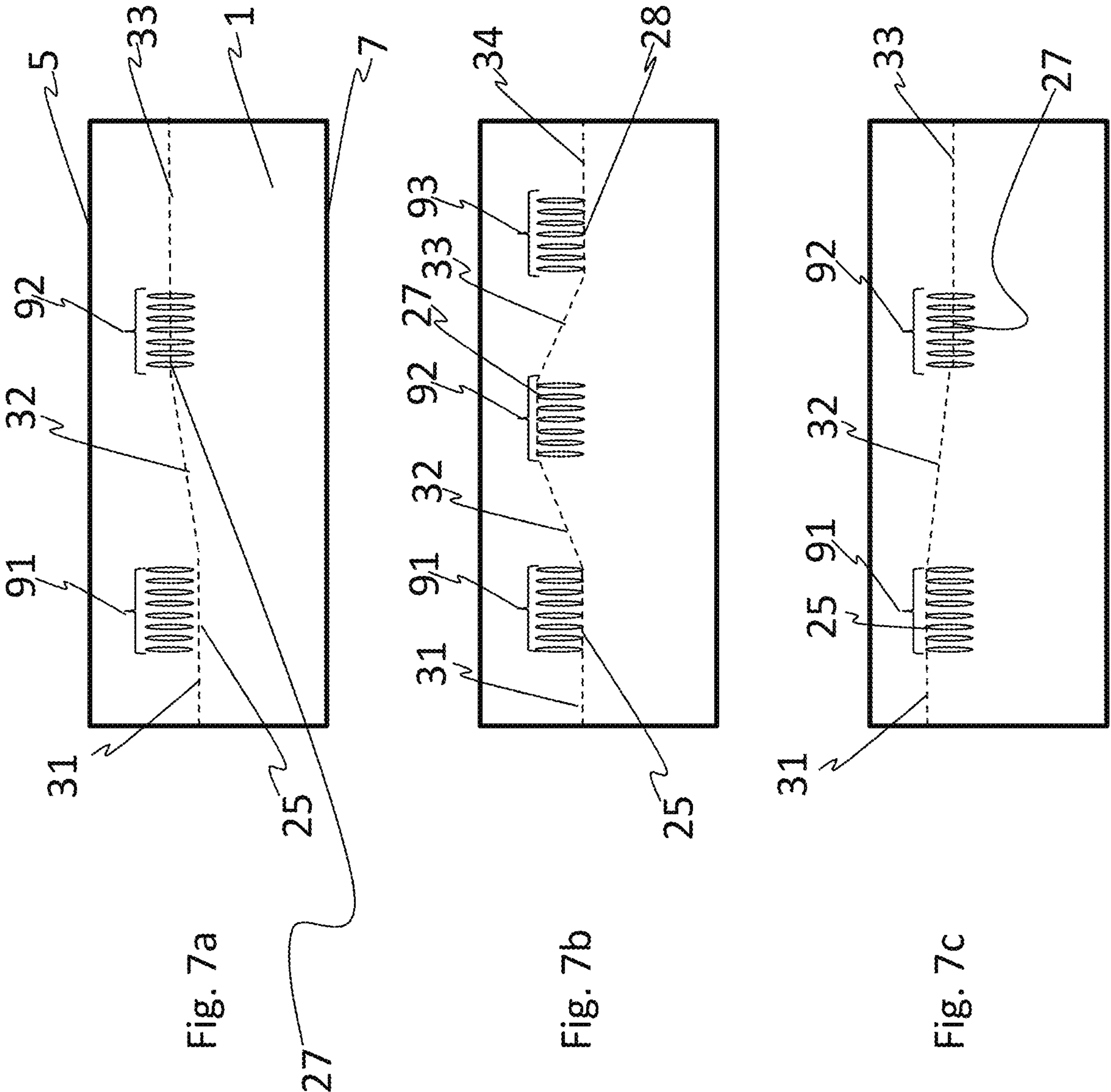
FIGS. 7*a-c* show three schematic views of exemplary fissure profiles.

FIGS. 7*a* to 7*c* show embodiments according to which the course of the detachment zone 2 is controlled as a result of the generation of modification blocks 91, 92, 93 in such a manner that predetermined patterns or thickness variations are produced or compensated. The course of the detachment zone 2 is in this case adjustable for example by means of the number of modifications 9 and/or the size of the modifications 9 and/or the spacing of the individual modifications 9 of a block 91, 92, 93.

In FIG. 7*a* the detachment zone 2 is formed by the components mentioned hereinafter: fissure 31 between outer edge and first modification block 91, followed by the first fissure portion 25 which is produced directly by the first block 91 of modifications 9, which is followed by fissure 32 between the two modification blocks 91 and 92, which is followed by the second fissure portion 27, which is produced directly by the second block 92 of modifications 9, followed by the fissure 33 between the modification block 92 and the further outer edge of the solid 1. It is thereby apparent that the detachment zone 2 can be predefined in such a manner that a fissure for separation of the solid layer 12 from the solid 1 can run in sections on different planes.

According to FIG. 7*b*, it is apparent that the detachment zone 2 can be selected in such a manner that the fissure course includes several geometrical turning points.

FIG. 7*c* shows purely as an example another possible configuration of the detachment zone 2.

With regard to FIGS. 7*a*-7*c*, it should be noted that the formation of wavy courses can afford advantages in the further treatment of the exposed surfaces, in particular in subsequent grinding and/or polishing steps. As a result of the actually very low height of the modifications 9, the actual waviness produced by this can only be detected with very high resolution. By means of modification blocks such as for example the blocks 91, 92, 93, the fissure can however be guided in a very well controlled manner in the regions in which none or few modifications 9 are produced.

Figures 8A, 8B, 8C:
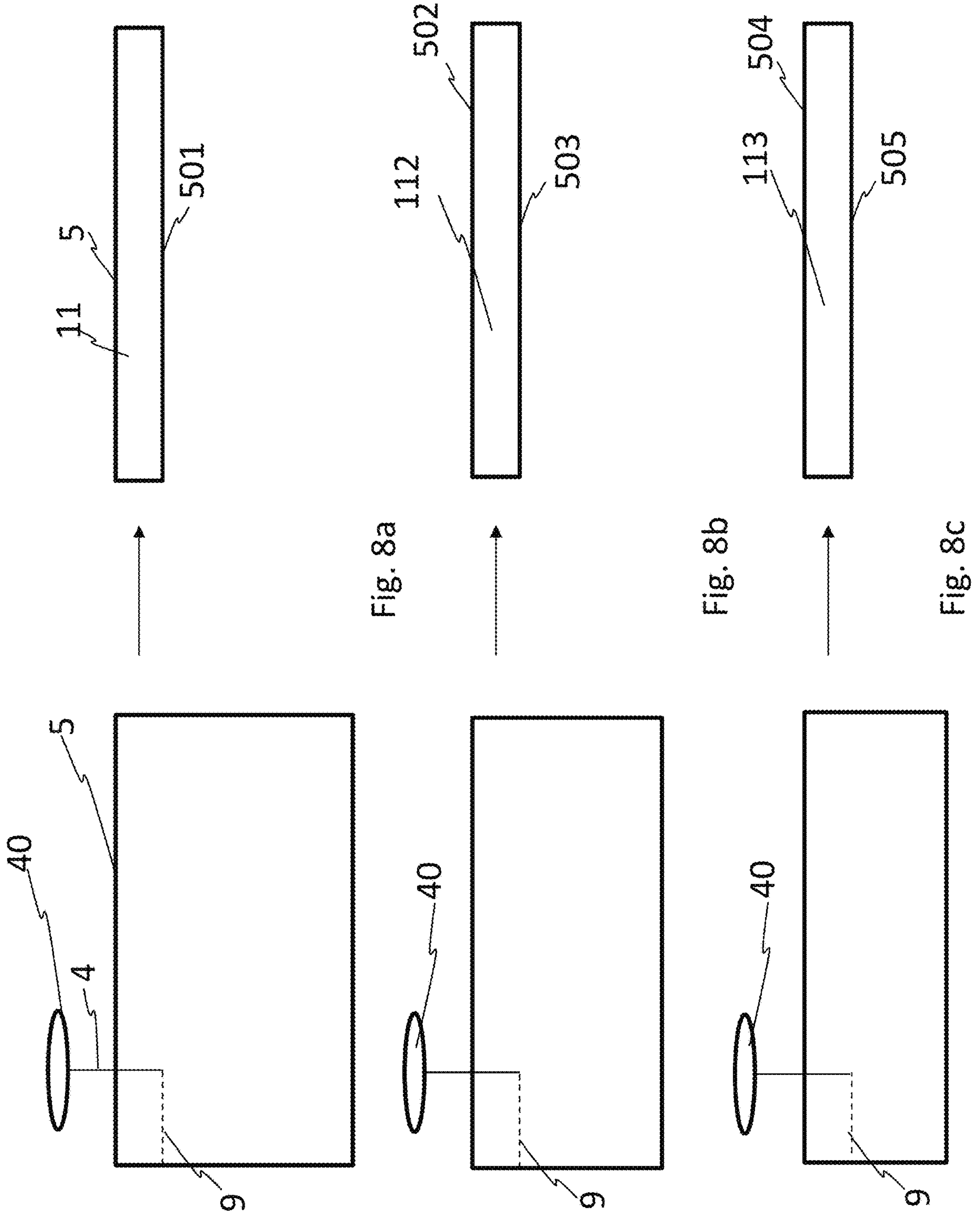
FIGS. 8*a-c* show the multiple separation of solid portions or solid layers, in particular wafers, from a solid.

FIGS. 8*a*-8*c* show a multiple processing of a solid 1, in particular an ingot, wherein the solid 1 is in each case thinned by a solid portion 12, in particular a solid layer 12. These diagrams do not show any receiving layers 140 to be applied, as shown in FIG. 2. In the sense of the present invention however, a receiving layer 140 can be applied in each case for receiving the solid portion 12 and for triggering and/or promoting a fissure also on the surface 5, 502, 504.

FIGS. 8*a*-8*c* therefore each show the application of laser radiation from the laser light source to the solid 1, wherein the laser beams penetrate into the solid 1 via a surface 5, 502, 504 of the solid layer 12 to be separated. A predefined portion of the solid 1 inside the solid 1 is temperature-controlled by the laser radiation in a defined manner to form a detachment zone 2 or a plurality of partial detachment zones, where the temperature produced in the predefined portion of the solid 1 is preferably so high that the material forming the predefined portion undergoes modification 9 in the form of a predefined material conversion. The number and arrangement of the modifications 9 is adjustable and is preferably predefined. After separation of the solid portion 12, a renewed application of laser radiation from the laser light source is made to the residual solid 1, wherein the laser radiation temperature controls a predefined portion of the solid 1 inside the solid 1 in a defined manner to form a detachment zone 2, and the temperature produced in the predefined portion of the residual solid 1 is again so high that the material forming the predefined portion undergoes of a predetermined material conversion. Thus, for example solid portions 12 having the same, similar or different thickness, in particular solid layers 12, in particular wafers, can be separated from a solid 1. Preferably the solid 1 has such a length that a plurality of, in particular more than 2 or more than 5 or more than 10 or more than 20 or more than 50 or more than 100 or more than 150 or more than 200 solid layers 12 having a thickness of less than 1000 μm, in particular of less than 800 μm or less than 500 μm, or of less than 300 μm or of less than 200 μm or of less than 150 μm or of less than 110 μm or of less than 75 μm or of less than 50 μm can be separated therefrom. Preferably each separation of a solid layer 12 is follow by a machining of the newly exposed surface 502, 504 of the residual solid 1.

FIGS. 9*a*-9*f* show schematic views of different process situations such as can occur according to the method according to the invention for producing solid layers 12.

Figures 9A, 9B, 9C, 9D, 9E, 9F:
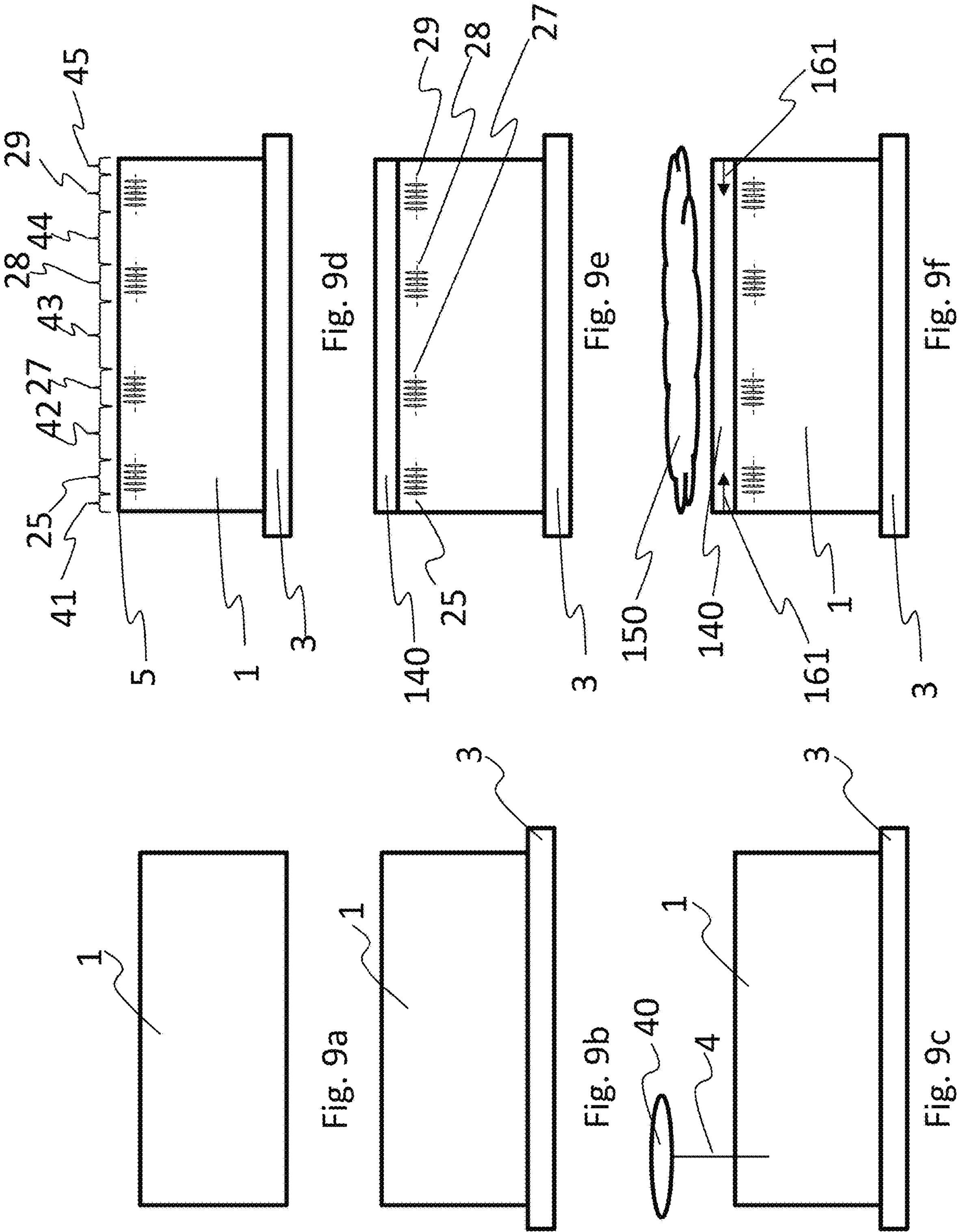
FIGS. 9*a-f* show several steps from preparation of the solid as far as fissure triggering as a result of thermal action on the receiving layer.

FIG. 9*a* shows the preparation of the solid 1, in particular an ingot.

Figure 11:
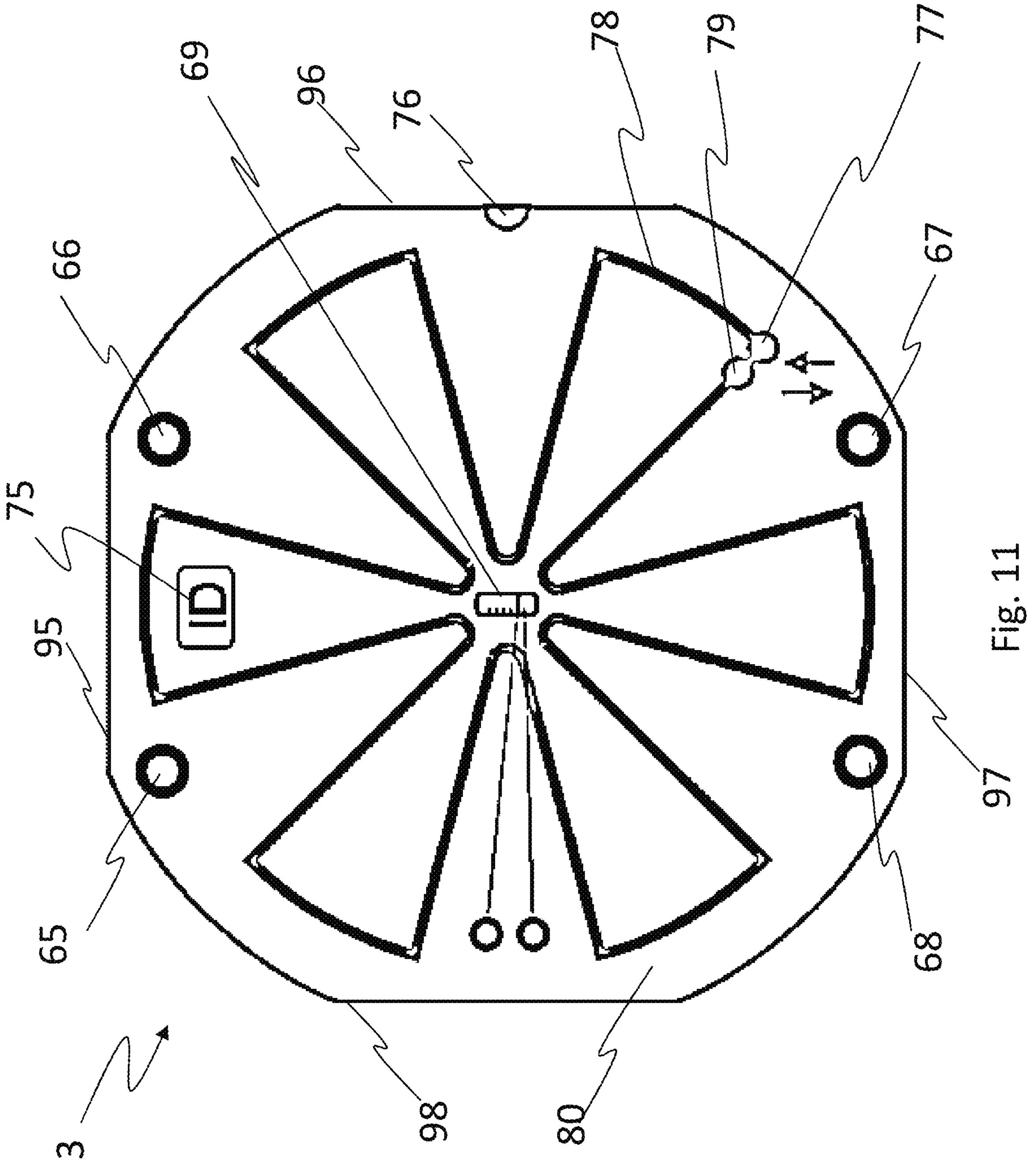
FIG. 11 shows a schematic view of a cooling device, in particular a cooling chuck.

According to FIG. 9*b*, the prepared solid 1 is arranged on a cooling device 3. Preferably the cooling device 3 is a cooling chuck. Particularly preferably the solid 1 is coupled on or glued on or welded on or screwed on or clamped on a tool carrier (chuck), wherein the tool carrier preferably comprises a cooling functionality and is thus preferred to the cooling device 3. The tool carrier preferably consists of an alloy having a composition of 45%-60%, in particular 54% iron, 20%-40%, in particular 29% nickel and 10%-30%, in particular 17% cobalt. The percentage information here relates to the proportion of the total mass. An example for a preferred cooling device 3 is shown in FIG. 11. The solid 1 and the cooling device 3 preferably have the same or a similar thermal expansion. Similar thermal expansion is understood here as preferably that thermal expansion with a temperature increase of 10 °C in a temperature range from −200 °C to 200 °C for which the difference in the thermal expansions of the solid 1 and the cooling device 3 is less than 50%, in particular less than 25% or less than 10% of the thermal expansion of the most strongly expanding object (cooling device or ingot). The thermal expansion of the solid 1 is preferably less than 10 ppm/K, in particular less than 8 ppm/K or less than 5 ppm/K such as for example less than 4 ppm/K or substantially 4 ppm/K or precisely 4 ppm/K.

The solid 1 is preferably fixed, in particular glued, on the cooling device 3 in the longitudinal direction with its underside 7 which preferably lies in the longitudinal direction opposite the surface 5. The laser beams are therefore introduced into the solid 1 to produce the modifications 9 via the surface 5 which is part of the solid layer 12 to be separated, in the direction of the cooling device 3.

FIG. 9*c* shows schematically the production of the modifications 9 by means of the laser radiation. The cooling device 3 has the effect here that the energy or heat introduced by the laser radiation into the solid 1 is at least partially and preferably mostly removed from the solid 1.

FIG. 9*d* shows a schematic sectional view of the solid 1 after generation of the modifications 9. According to the example, four blocks of modifications 9 can be seen, which lead to the four fissure portions 25, 27, 28, 29. Adjacent to the blocks with modifications 9 the reference numbers 41, 42, 43, 44 and 45 each characterize regions without modifications 9 or regions in which fewer modifications 9 are produced than in the regions in which the blocks of modifications 9 are produced.

FIG. 9*e* shows a state according to which a receiving layer 140, in particular comprising a polymer material, is arranged or produced on the surface 5 via which the laser beams have penetrated into the solid 1. The receiving layer 140 has preferably been produced as a film and has been glued to the surface 5 after its production. However, it is also possible to form the receiving layer 140 by application of a liquid polymer to the surface 5 and subsequent solidification.

FIG. 9*f* shows schematically a temperature control of the receiving layer 140. Preferably the receiving layer 140 is temperature-controlled in particular cooled to a temperature of less than 20 °C, or of less than 10 °C or less than 0 °C or less than −10 °C or less than −50 °C or less than −100 °C. In this case, the material of the receiving layer 140 undergoes a glass transition as a result of the cooling. Preferably the receiving layer 140 is temperature-controlled by means of liquid nitrogen. As a result of the temperature control, in particular as a result of the glass transition, the receiving layer 140 contracts, with the result that mechanical stresses are produced in the solid 1. As a result of the mechanical stresses, a fissure connecting the fissure portions 25, 27, 28, 29 is triggered which separates the solid portion 12 from the solid 1.

FIG. 10*a* shows a view after the temperature control of the receiving layer 140 shown in FIG. 9*f*. The solid portion 12 is separated from the solid 1 with the receiving layer 140 still arranged thereon.

FIG. 10*b* shows a renewed step of introducing modifications 9 into the residual solid 1 which is reduced in its length at least by the already-separated solid layer 12.

FIG. 10*c* shows schematically another preferred configuration. The cooling device 3 is here coupled to the solid 1 on one side and to a travel device 30 on the other side, in particular an X/Y travel device or a rotary table. The travel device 30 brings about a movement of the solid 1, whereby this can be moved in a defined manner with respect to the surroundings and a laser optical system in particular a scanner.

FIG. 10*d* shows another detailed schematic view of FIG. 10*c*. The round arrow inside the travel device 30 indicates that this is rotatable. Furthermore, a coupling layer, in particular an adhesive layer is provided between the solid 1 and the cooling device 3. The coupling layer 30 is here preferably executed in such a manner that it withstands a plurality of treatment cycles, in particular more than 300 or more than 500 treatment cycles with high mechanical and thermal loading. Furthermore, it can be seen from this diagram that the laser beam source 401 preferably guides laser beams along a first laser beam conductor 402 to an optical system 40, from which the laser beams reach a scanner by means of another laser beam conductor 403. Alternatively it is also feasible here that at least the laser beam source 401 and the scanner 400 are provided.

FIG. 11 shows the cooling device 3. The cooling device 3 preferably has a guide-support structure which is preferably formed by a tool carrier, in particular a chuck. This guide-support structure preferably has a round basic shape. This is advantageous since an imbalance can be more easily avoided with regard to spinning processes. Furthermore the round basic shape is preferably provided with flat sections 95-98. These flat sections are advantageous since they allow or facilitate a coarse alignment and/or coffering.

Preferably the cooling device 3, in particular the guide-support structure of the cooling device 3, has a good thermal conductivity. Furthermore the cooling device 3 preferably comprises anodized aluminium which reduces or prevents abrasion particles. This is advantageous since the clean room compatibility is thereby increased. Furthermore the chuck is preferably compatible with the detachment process.

Furthermore at least two aligning elements 65-68 are provided. Preferably the aligning elements 65-68 are configured as aligning holes or slots or pins. The aligning elements 65-58 preferably form cams for the non-positive and/or positive transmission of rotation. Preferably the aligning elements 65-68 are used for coupling the cooling device 3 to the travel device 30.

Furthermore register pins can be provided, these can be designed for example as downholders, whereby for example a force and/or form fit with the guide-support structure can be produced.

Furthermore, a notch, groove or marking 76 is preferably provided on the cooling device 3. This feature is advantageous since the solid orientation, in particular ingot orientation, is thereby apparent. The knowledge about the orientation of the solid, in particular the ingot can be used to adapt the modifications 9 produced by means of the laser beams to the crystallographic orientation.

The reference number 75 characterizes purely as an example an optional data carrier element and/or data transfer element and/or data acquisition element. Preferably the element characterized by the reference number 75 is designed as a barcode and/or RFID element and/or SAW sensor. This in particular allows integration in a manufacturing execution system (MES).

Furthermore, cooling channels for guiding a cooling fluid are preferably provided or formed on or in the guide-support structure. The cooling channel or channels 78 can be used for temperature control of the solid 1, the cooling device 3 and/or a machine holder, in particular the travel device 30. Cooling fluid, in particular a liquid, can be supplied into the cooling channel 78 via an inlet 77 and removed via an outlet 79. The interface or coupling layer between solid 1 and cooling device 3 preferably has a high thermal conductivity, in particular corresponding to the thermal conductivity of the solid 1 or the cooling device 3. The cooling device 3 can additionally or alternatively be cooled via the air interface. At high speeds or travel speeds of the travel device 30, the air layer formed around the cooling device 3 is very thin so that heat can be removed very efficiently.

Furthermore, an active thermostatic control is preferably integrated in the MES. Additionally or alternatively, a process monitoring is carried out for different substrate sizes and thicknesses.

Preferably the fluid channels are sealed in the case of fixed mounting by means of pressing and in the case of rotation by means of a central annular seal for example.

The reference number 69 characterizes an optional sensor device which is preferably designed as a temperature sensor. Preferably the sensor device is an SAW temperature sensor.

Figure 12:
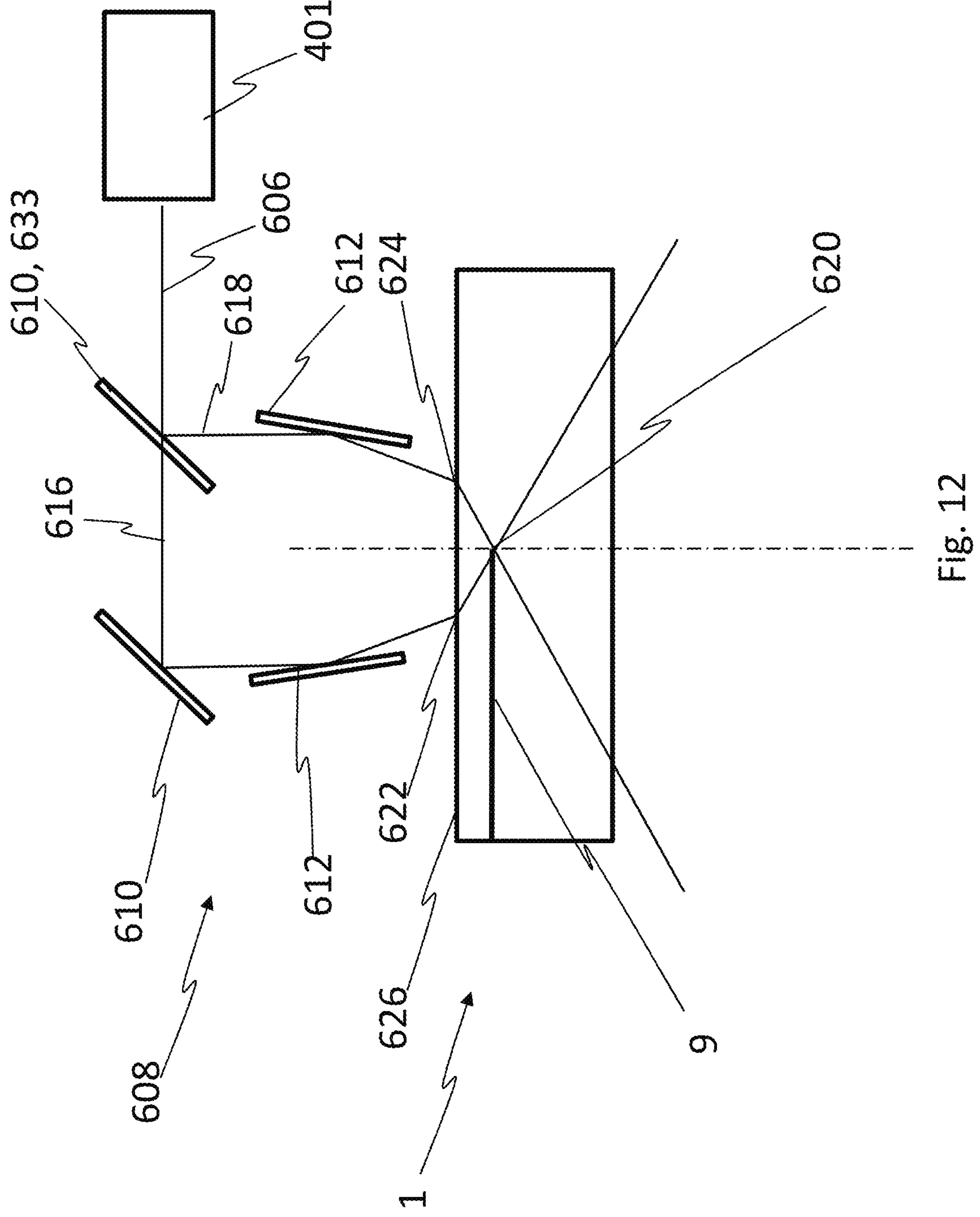
FIG. 12 shows a schematic view of an optical system preferably used.

FIG. 12 shows the optical system 40, 608 preferably used to produce the modifications 9. Thus, the method according to the invention preferably also comprises the step of providing an optical system 40, 608, wherein the optical system 608 preferably comprises at least two deflecting elements 610, 612 for deflecting light beam components 616, 618. The light beams 616, 618 are preferably produced and emitted by the laser beam source 401. Furthermore the method according to the invention preferably comprises the step of deflecting at least two different light beam components 616, 618 of the emitted light beam 606 by means of the deflecting elements 610, 612, 613, wherein the light beam components 616, 618 are deflected in such a manner that they penetrate into the solid 1 and wherein the differently deflected light beam components 616, 618 meet at a focus 620 inside the solid 1 and the physical modification 9, in particular in the form of a lattice defect, is produced by the light beam components 616, 618 meeting at the focus 620 or the step of producing and emitting at least two light beams 606 by the laser beam source or radiation source arrangement 401. The method according to the invention further preferably comprises the step of deflecting the light beams 606 by means of the deflecting elements 610, 612, 613, wherein the light beams 606 are deflected in such a manner that they penetrate into the solid 1 and wherein the differently deflected light beams 606 meet at a focus 620 inside the solid and the physical modification 9, in particular in the form of a lattice defect, is produced by the light beams (6) meeting at the focus 620.

It is additionally feasible that at least two different light beam components 616, 618 of at least one emitted light beam 606, in particular the light beam components of several emitted light beams or the several emitted light beams 606 are deflected by means of the deflecting elements 610, 612, 613, wherein the light beam components 616, 618 or the light beams 606 are deflected in such a manner that they penetrate into the solid 1 and wherein the differently deflected light beam components 616, 618 or the differently deflected light beams 606 meet at a focus 620 inside the solid 1 and the physical modification 9, in particular in the form of a lattice defect, is produced by the light beam components 616, 618 or light beams 606 meeting at the focus 620.

Furthermore, according to the method according to the invention, when several light beams 606 are produced simultaneously, at least two light beams 606 and preferably all the light beams 606 are split into different light beam components 616, 618 which in particular cover different paths and penetrate into the solid 1 at spaced apart surface components 622, 624 of the solid 1, wherein the light beam components 616, 618 of a respective light beam are deflected by means of different deflecting elements 610, 612, 613.

The optical system 608 preferably comprises at least one light beam splitting means 633, in particular a half-mirror or beam splitter, and at least one light beam 606 is split by means of at least the light beam splitting means 633 into at least two light beam components 616, 618. Preferably a light beam 606 is split by means of a light beam splitting means 633, in particular a half-mirror, into at least two light beam components 616, 618, wherein one light beam component 616 is deflected by at least two deflecting elements 610, 612, 613, in particular mirrors, in such a manner that it meets the other light beam component 618 inside the solid 1 to form a focus 620 for producing the physical modification 9. Particularly preferably a plurality of physical modifications 9 are produced, wherein the physical modifications 9 preferably form or describe a plane and/or a contour and/or a silhouette and/or the outer shape of a body.

The at least one light beam 606 emitted by the laser beam source 401 preferably consists of coherent light and the light waves of the light beam components 616, 618 meeting at the focus 620 preferably have the same phase and the same frequency.

Particularly preferably at least one light beam component 616, 618 or at least one light beam 606 is deflected and focused by a deflecting element 610, 612, 613 configured as a parabolic mirror.

Furthermore the at least one light beam component 616, 618 or the at least one light beam 606 before deflection and focusing preferably passes through a deflecting element 610, 612, 613, in particular a parabolic mirror, a beam shaping device, in particular a 1D telescope for changing the shape of the focus.

Preferably at least or precisely two light beams are produced by the laser beam source 401, wherein the light beams 606 are produced depending on the band gap of the material of the solid 1 with different colours in such a manner that the modification 9 is produced by a two-photon process.

Preferably a first laser field is formed by a first light beam 606, wherein the first light beam 606 comprises photons having a first energy and preferably a second laser field is formed by a second light beam 606, wherein the second laser beam 606 comprises photons having a second energy, wherein the first laser field is weaker than the second laser field and the first energy is higher than the second energy.

Figure 13:
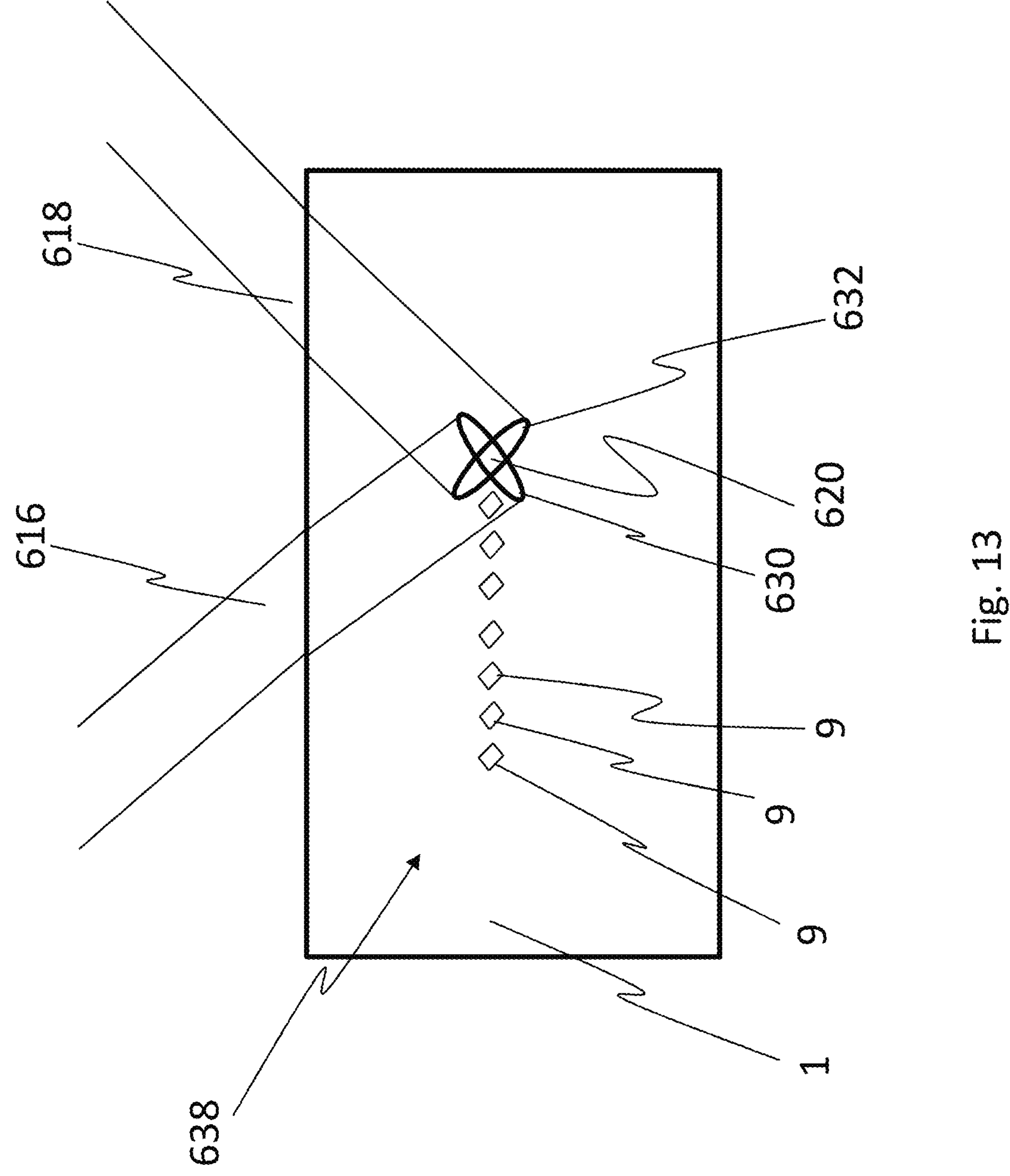
FIG. 13 shows a schematic view of superposed beams or beam components during the production of a modification in the solid.

FIG. 13 shows the production of a modification by means of two laser beams or two laser beam components in a schematic view. The modifications 9 here preferably have a vertical extension of less than 50 μm and preferably less than 30 μm and particularly preferably less than 20 μm.

The focus 620 is preferably less than 1000 μm and preferably less than 500 μm and particularly preferably less than 200 μm away from a penetration surface 626 of the solid 1, wherein at least individual light beam components 616, 618 penetrate into the solid 1 via the penetration surface 626 to produce the physical modification 9.

The focus 620 is preferably produced in the superposed portion of at least two intersecting light beam waists 630, 632, wherein the light beam waists 630, 632 are produced by the light beam components 616, 618 or light beams 606.

Figures 14A, 14B, 14C:
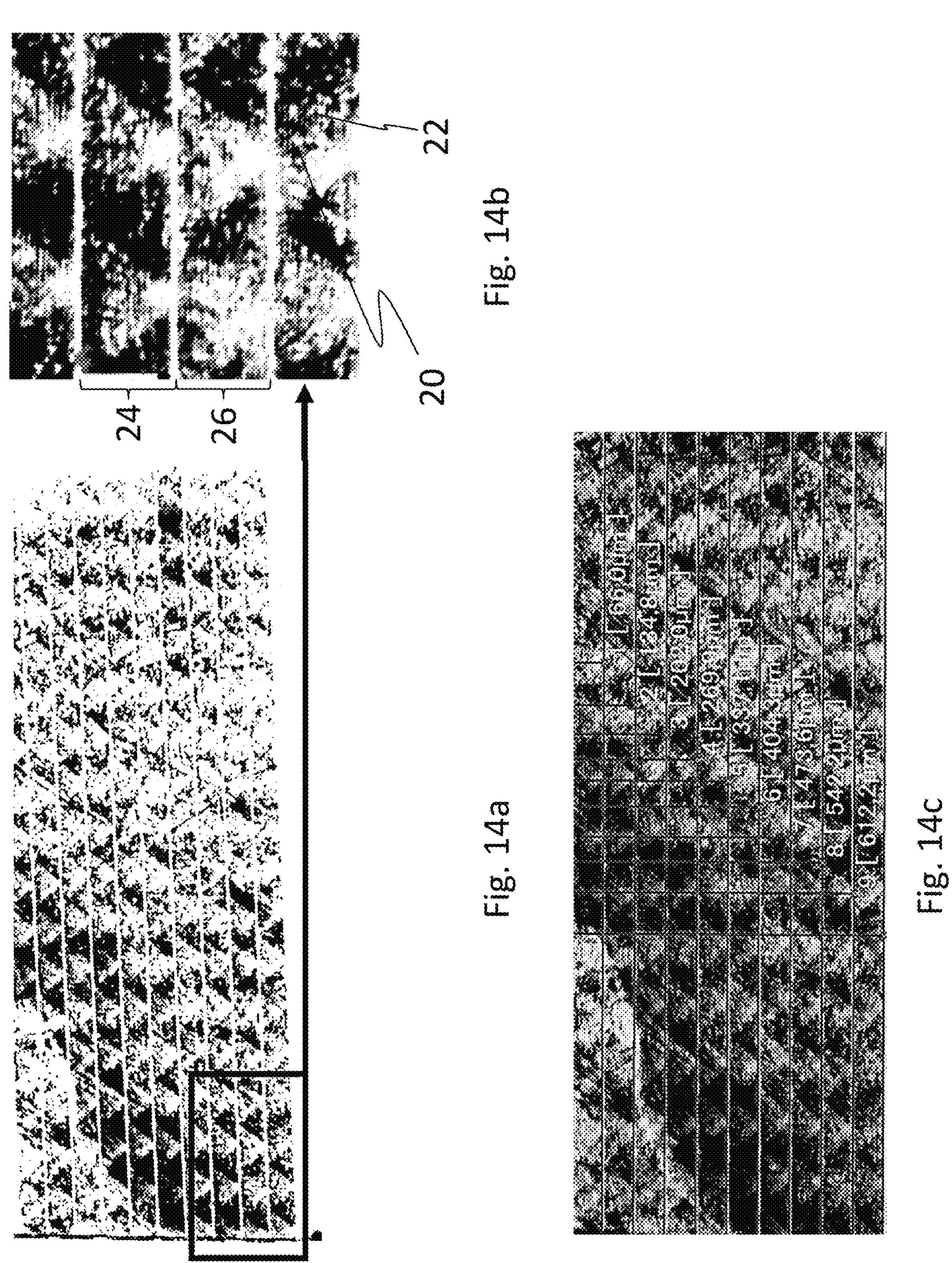
FIGS. 14*a*-14*c* show microscope photographs of crystal lattice modifications.

FIGS. 14*a* to 14*c* show different microscope views of a solid 1 conditioned or modified by means of lasers, in particular for the most part or substantially or completely consisting for example of a semiconductor material, in particular of SiC.

FIG. 14*a* shows a 6H-SiC line defect field 1E which was produced with pulse intervals of 0.4 μm, line spacings of linearly produced crystal lattice modifications 20, 22 of 2 μm and a pulse repetition frequency of 128 kHz. Here however it is also feasible that one of the parameters, several of these parameters, in particular two of these parameters or all of these parameters (pulse intervals, line spacings, pulse repetition frequency) are specified in a varied or changed manner. Thus, pulse intervals for example between 0.01 μm and 10 μm can be provided and/or line spacings between 0.01 μm and 20 μm can be provided and/or a pulse repetition frequency between 16 kHz and 1024 kHz can be provided.

FIG. 14*b* shows an enlarged detailed view of the region characterized by the frame in FIG. 14*a*. It can be seen that the block spacings 24, 26 are preferably uniform and for example are 66 μm. FIG. 14*c* also shows block spacings which lie around 66 μm. However, it is also feasible that the block spacings lie in different ranges, such as for example in the range between 4 μm and 1000 μm.

The diagram in FIG. 14*a* shows a plan view of a solid through a polished surface of the solid. The structure shown is therefore formed inside the solid or has been produced by modifications, in particular by means of lasers.

Fissure formation is preferably not initiated in the configuration shown.

Figures 15A, 15B:
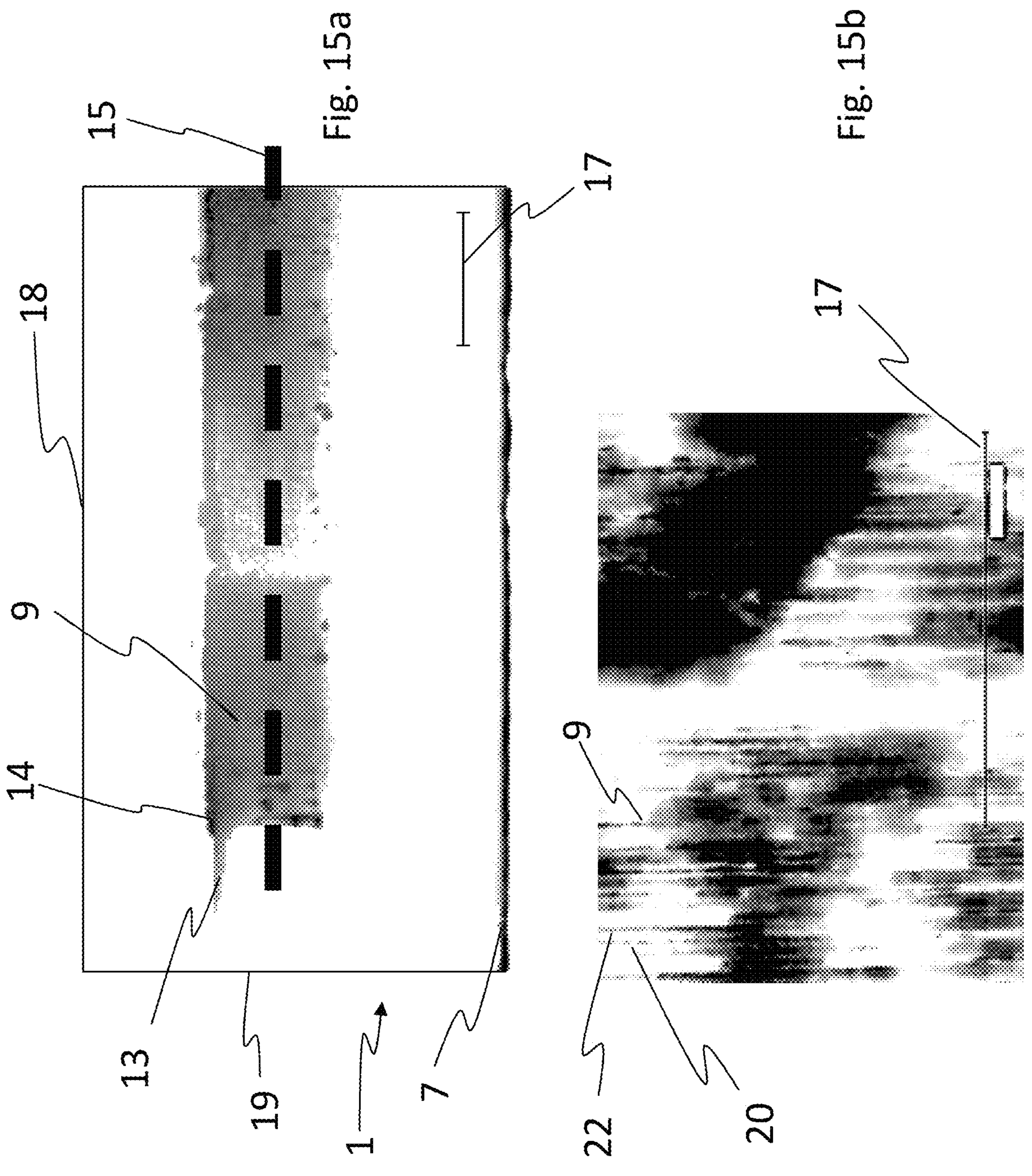
FIGS. 15*a*-15*b* show further microscope photographs of crystal lattice modifications.

FIGS. 15*a* and 15*b* show microscope views of solids modified in the sense of the invention. In FIG. 15*a* the reference number 14 preferably characterizes the location of a processing start, i.e. the location at which the modification of the crystal lattice of the solid 1 is preferably commenced. The reference number 9 characterizes the modified region in the solid 1. It can be seen from this diagram that off-centre from the modified region 9 or offset with respect to the centre 15 of the modified region 9 a fissure 13 propagates in the solid. It is possible here that the location and the direction of propagation of the fissure 13 are predefined in a defined manner by defined parameters to produce the modification, wherein in the example shown the fissure 13 preferably runs parallel or substantially parallel to the main surface 18. The fissure 13 can thus be produced or triggered and guided by parameter setting(s) specifically through the modifications 9, at the edge of the modifications 9 or at a distance from the modifications 9.

The underside of the solid 1, in particular the wafer, is specified by the reference number 7. Furthermore, the reference number 17 indicates a reference length which preferably measures 50 μm. The cross-sectional area shown extends at right angles to the main surface 18 of the solid 1, i.e. over the height of the lateral surface 19, wherein the modifications 9 are preferably introduced into the solid 1 via the main surface 18 or the production of the modifications 9 is preferably brought about through the main surface 18. The main surface 18 is particularly preferably a multiple, in particular at least twice or at least three times or at least four times or at least 10 times or at least 20 times or at least 50 times larger than the lateral surface 19.

FIG. 15*a* preferably shows a 6H-SiC line defect field 1E which was produced with pulse intervals of 0.2 μm, line spacings of linearly produced crystal lattice modifications 20, 22 of 3 μm and a pulse repetition frequency of 128 k Hz. Here however it is also feasible that one of the parameters, several of these parameters, in particular two of these parameters or all of these parameters (pulse intervals, line spacings, pulse repetition frequency) are specified in a varied or changed manner. Thus, pulse intervals for example between 0.01 μm and 10 μm can be provided and/or line spacings between 0.01 μm and 20 μm can be provided and/or a pulse repetition frequency between 16 kHz and 1024 kHz can be provided.

FIG. 15*b* shows a plan view of a part of the solid 1 and through the polished main surface 18 of the modifications 9. The individual modifications 9 are produced according to this diagram in such a manner that several of them form a line 20, 22. However it is also feasible here that the modifications are produced homogeneously at least partially in more than one direction, in particular in two directions, in at least two directions or in three directions. Thus, the modifications 9 are particularly preferably produced so that they are distributed preferably uniformly or homogeneously in a plane parallel to the main surface 18. However it is also feasible that in one direction (length or width or height), more modifications 9 are produced than in one or two other directions. Furthermore it is feasible that the modifications 9 are produced in such a manner that they form patterns. Furthermore the modifications 9 in the sense of the present invention can be produced in different regions of the solid 1, wherein the regions preferably have the same dimensions, in different numbers and/or with different parameters.

The reference number 17 characterizes in FIG. 14*b* a reference length which preferably measures 100 μm.

Figures 16A, 16B:
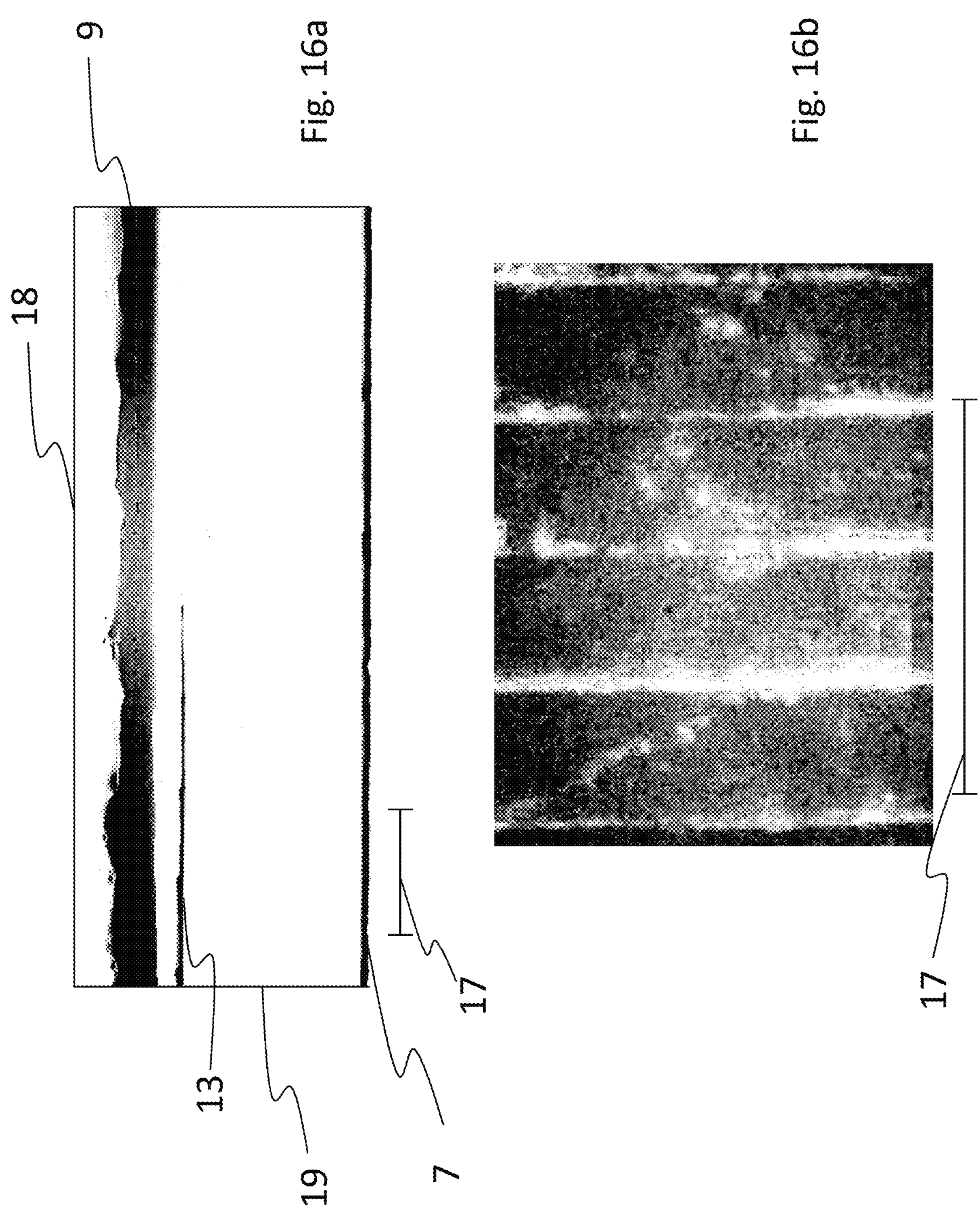
FIGS. 16*a*-16*b* show yet further microscope photographs of crystal lattice modifications.

FIG. 16*a* preferably shows a 6H-SiC line defect field 1E which was produced with pulse intervals of 0.2 μm, line spacings of linearly produced crystal lattice modifications 20, 22 of 1 μm and a pulse repetition frequency of 128 k Hz. Here however it is also feasible that one of the parameters, several of these parameters, in particular two of these parameters or all of these parameters (pulse intervals, line spacings, pulse repetition frequency) are specified in a varied or changed manner. Thus, pulse intervals for example between 0.01 μm and 10 μm can be provided and/or line spacings between 0.01 μm and 20 μm can be provided and/or a pulse repetition frequency between 16 kHz and 1024 kHz can be provided.

It can be further deduced from FIG. 16*a* that a fissure 13 propagates in the solid 1 at a distance from the produced modifications 9. The fissure 13 therefore propagates at a distance from the centre of the modifications 9 or the fissure propagates in a region of the solid 1 which is spaced apart from the main modification portion. The main modification portion is for example in the case of laser-produced modifications 9 preferably the portion of the solid 1 in which the lase has its focus.

The reference number 17 characterizes a reference length which is preferably 100 μm.

Figures 17A, 17B, 17C, 17D, 17E, 17F:
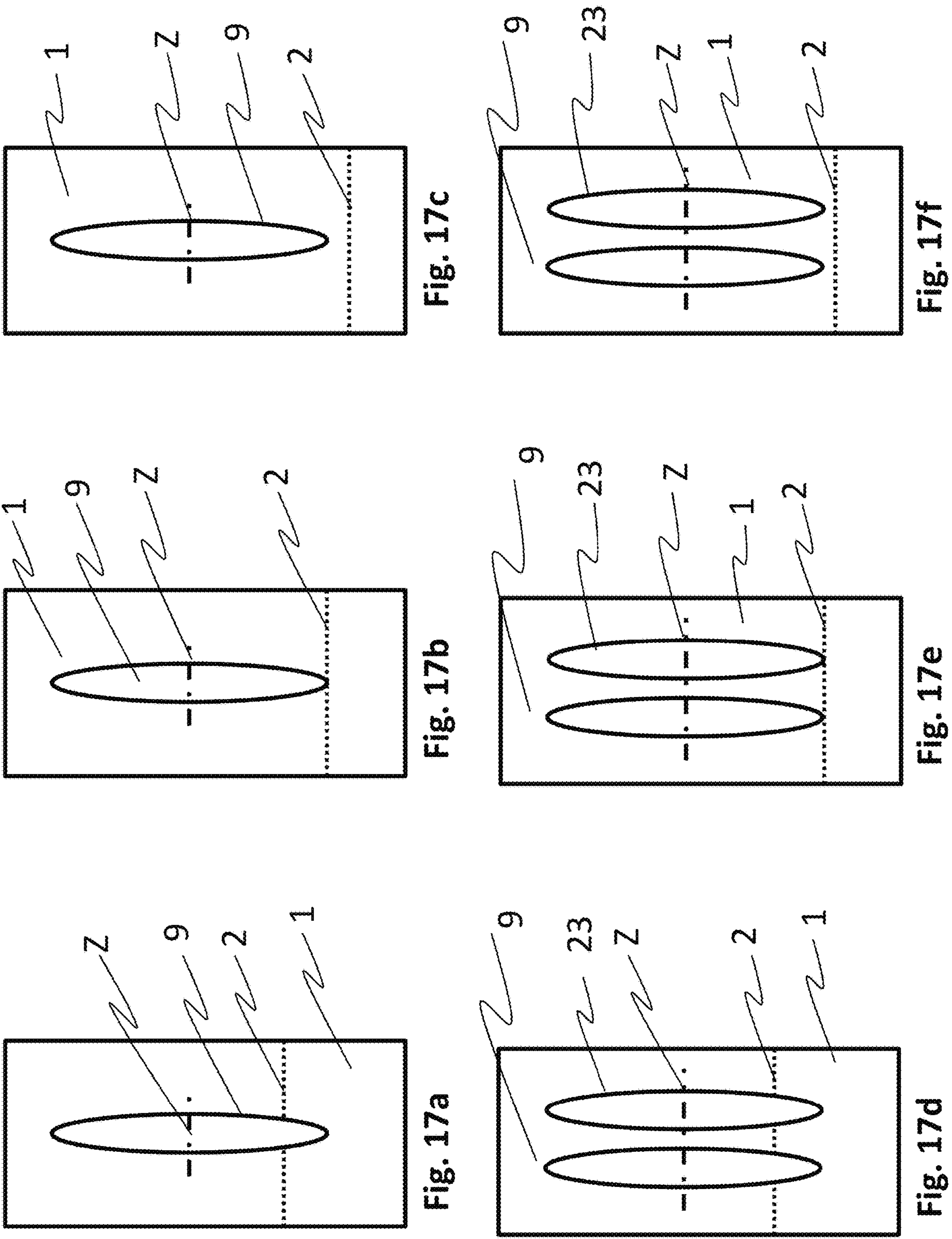
FIGS. 17*a*-17*f* show schematic views of modifications and the detachment zone.
Figures 18A, 18B, 18C, 18D:
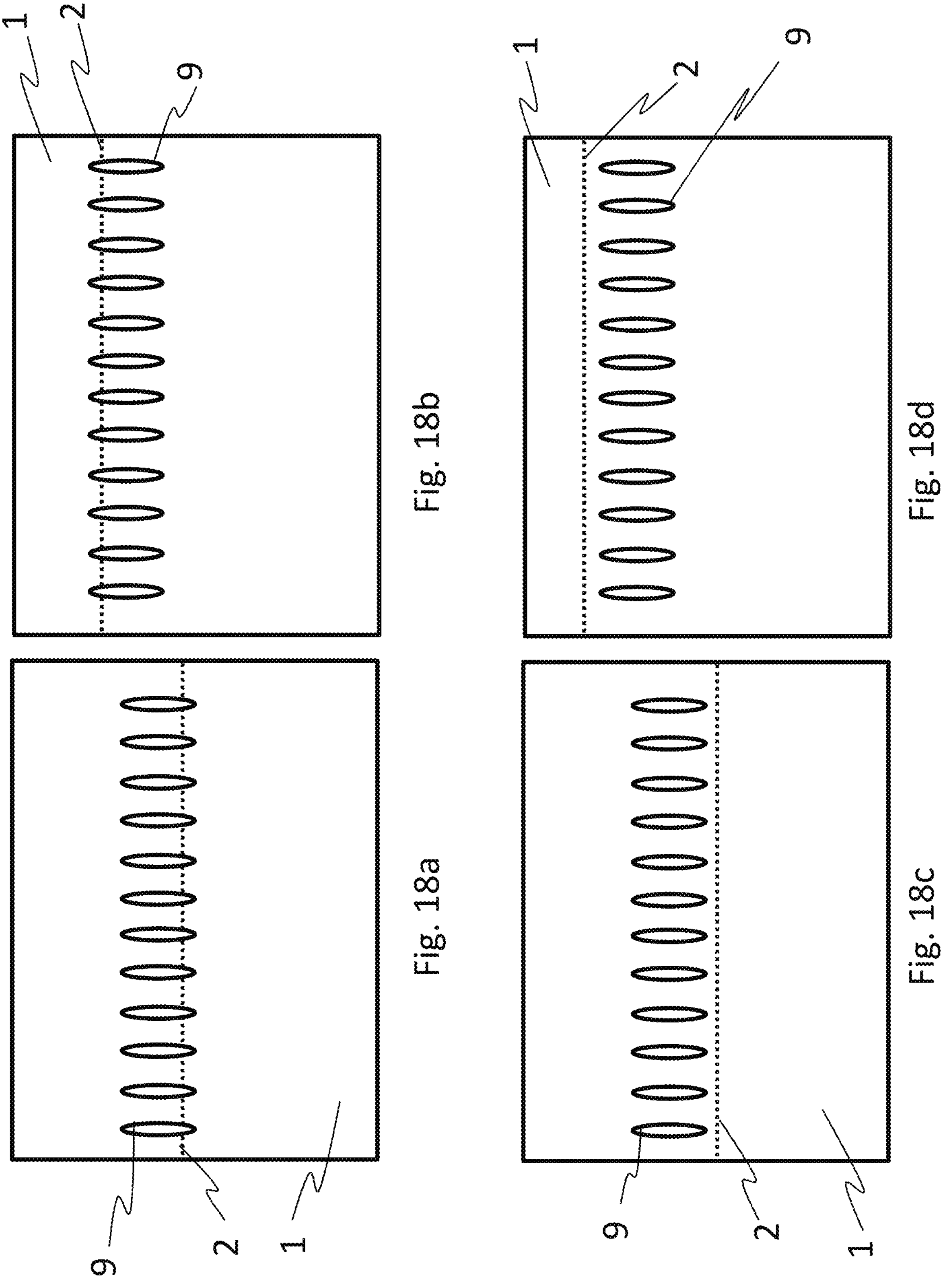
FIGS. 18*a*-18*d* show another schematic view of modifications and the detachment zone.

FIGS. 17*a* to 17*f* show different views of the modification-fissure formation relationship. FIG. 17*a* for example shows a modification 9 formed according to the shape of a laser waist. It is pointed out however that the shape of the modification 9 is only shown schematically. Furthermore, shapes differing from the shape shown are also possible. Thus, a modification 9 can preferably have a shape which lies in the design space between a spherical shape, in particular a circle, and a polygon, in particular a quadrilateral, in particular a rectangle such as for example a square. FIG. 17*a* further shows that the detachment zone 2 does not extend through the centre of the modifications 9. Preferably the detachment zone 2 is spaced apart from the centre of the modification by 1/20, or 1/10 or 1/5 or 1/4 or 1/3 of half the maximum length of the modification 9.

FIG. 17*b* shows for example a variant according to which the detachment zone 2 passes by the outer edge or in the region of the outer edge of the modification 9 passes by the modification 9 and therefore particularly preferably only passes the modification on the outside but does not pass through the modification.

FIG. 17*c* shows another variant according to which the detachment zone 2 is preferably spaced apart from the modification 9 by at least 0.01 μm or by at least 0.1 μm or by at least 1 μm or by at least 5 μm or by at least 10 μm.

FIGS. 17*d* to 17*f* are constructed similarly to FIGS. 17*a* to 17*c*. However, FIGS. 17*d* to 17*e* show a variant according to which the effect achieved by the modification 9, namely the local cutting through the crystal lattice of the solid 1 is only achieved by the cooperation of several modifications 9, in particular at least 2, 5, 10, 20, 50 or at least 100 modifications.

FIGS. 18*a* to 18*d* show different arrangements of modifications 9 and the detachment zones 2 resulting from the modifications 9. The parameters required to produce the modification can thus be adjusted as required in such a manner that the detachment zone 2 runs through the modifications 9 (cf. FIGS. 18*a* and 18*b*) or that the detachment zone 2 is spaced apart from the modifications 9 (cf. FIGS. 18*c*-18*d*).

Figures 19A, 19B, 19C, 19D:
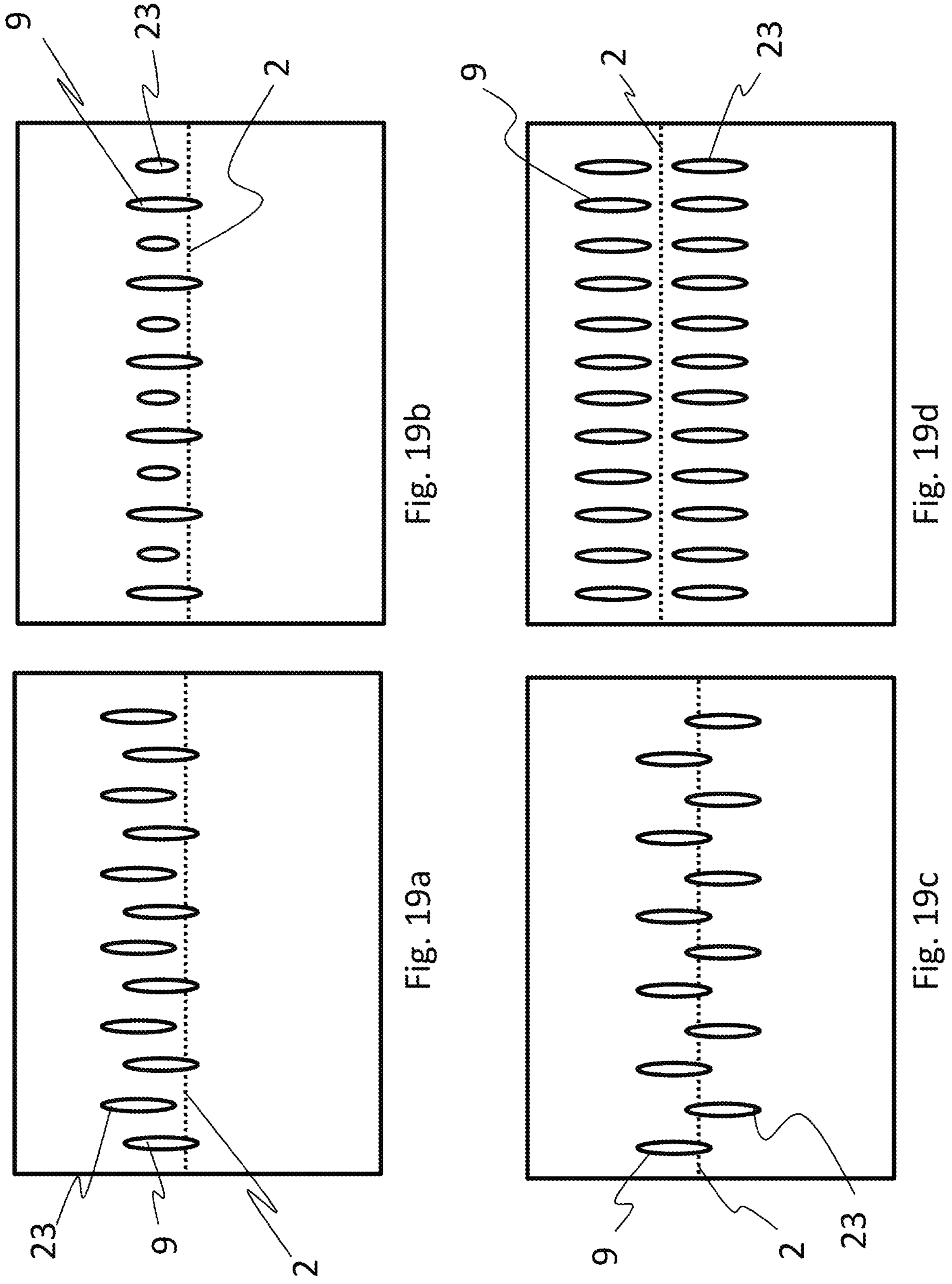
FIGS. 19*a*-19*d* show another schematic view of modifications and the detachment zone.

FIGS. 19*a*-19*d* show further variants according to which a detachment zone 2 is formed in a solid 1 as a result of the production of modifications 9. According to FIGS. 8*a* and 8*b*, the centres of the modifications 9 and 23 can be provided on one side of the detachment zone 2. However, it is also feasible here that the modifications are also produced identically apart from the site where they are produced (in particular the distance from the main surface). It is also feasible that additionally or alternatively to the location of the modifications 9, 23, the focus and/or the amount of energy and/or the application time etc. varies. FIGS. 19*c* to 19*d* show the centres of the modifications 9 and 23 in each case on different sides of the detachment zone 2.

It is also feasible here that the centres of the modifications 9, 23 are formed at the same distance or at different distances from the detachment zone 2. It is further feasible that additionally or alternatively to the location of the modifications 9, 23, the focus and/or the amount of energy and/or the application time etc. varies or is set differently.

Figure 20:
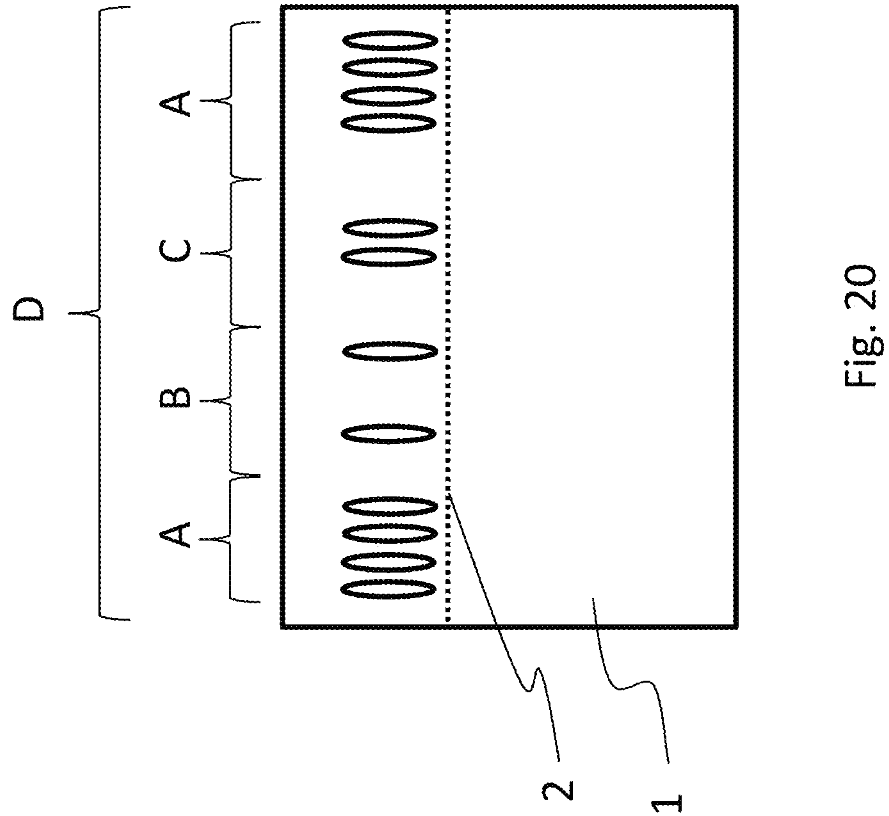
FIG. 20 shows a schematic view of different concentrations of modifications.

FIG. 20 shows an arrangement according to which the modifications 9 are produced in different concentrations (A-D) and/or distributions. It is feasible here, for example that in order to trigger a main fissure connecting the individual fissures, locally different modification concentrations or distributions are provided. Preferably more modifications are produced or a higher modification density is provided in the region of a main fissure triggering position.

It is further pointed out that the individual variants shown in FIGS. 17*a*-17*f*, 18*a*-18*d*, 19*a*-19*d*, 20 can preferably be combined with one another.

Figure 21:
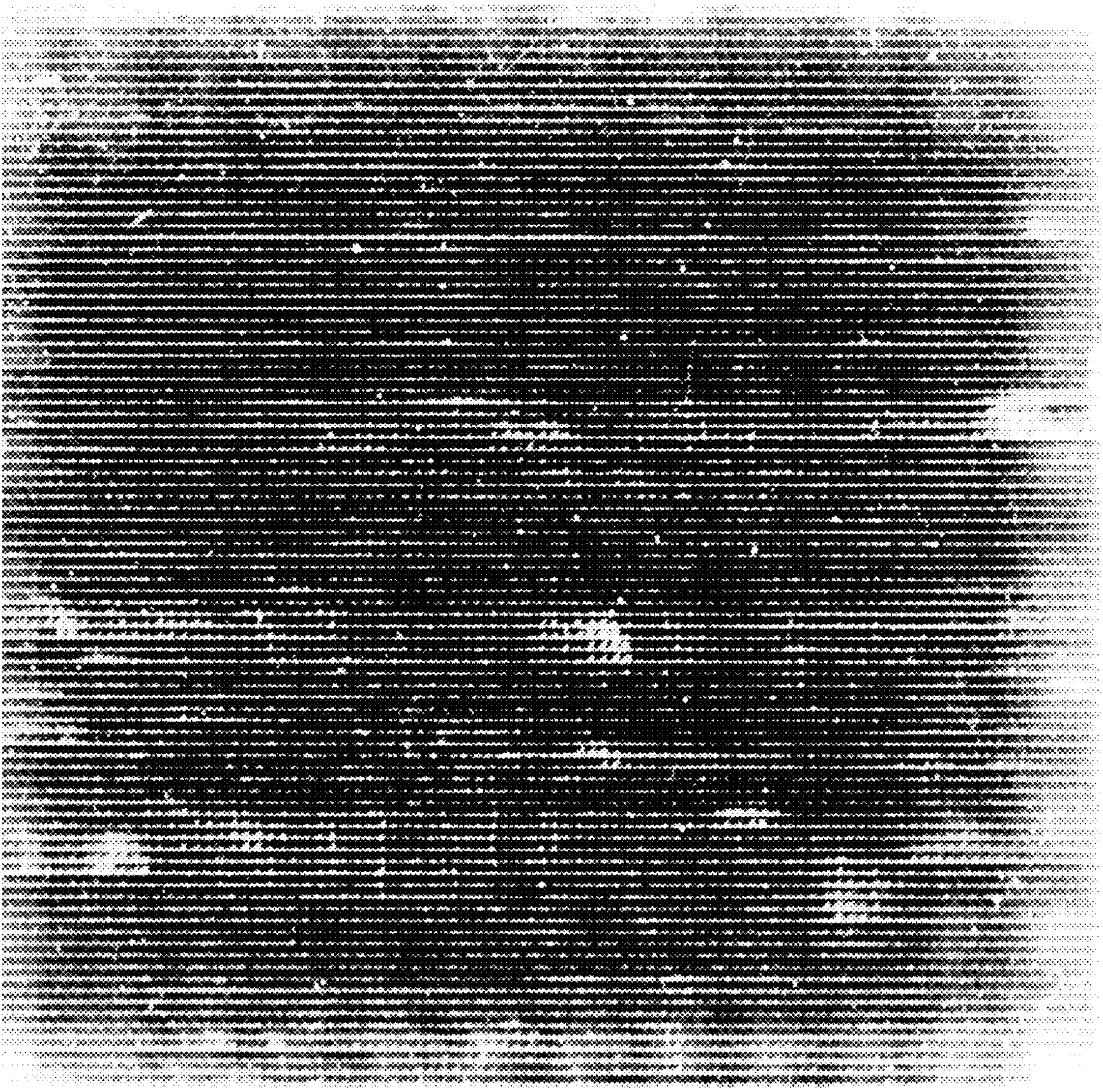
FIG. 21 shows a microscopic view of a plan view of the modifications produced through the polished surface of the solid.

FIG. 21 shows a plan view of a 6H-SiC line defect parameter field 1C, wherein preferably laser damage of 1 $cm^2$ and having a thickness of 245+/−3 μm is present. The plan view is made through the polished main surface of the solid 1 and shows a state before separation of a solid layer 11 along the detachment zone 2.

Figure 22B:
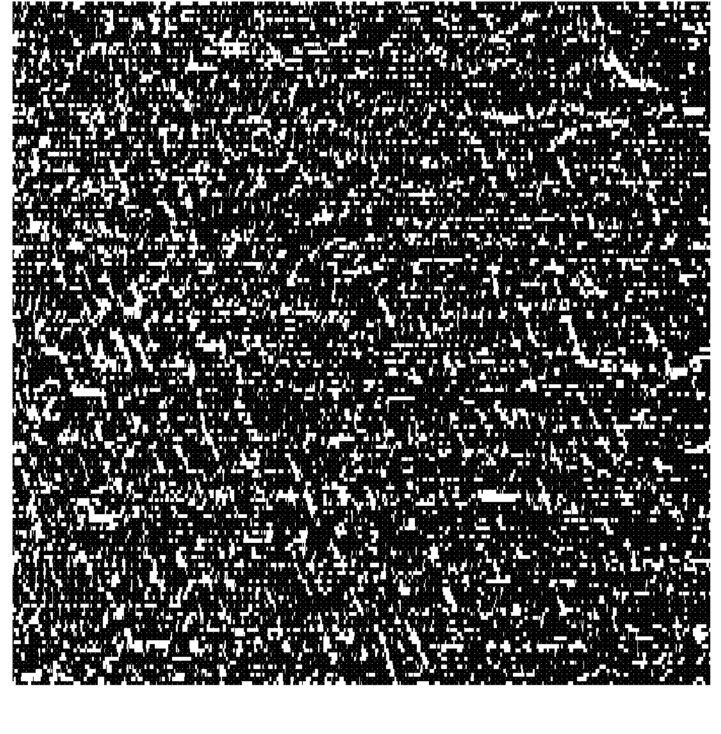
FIGS. 22*a*-22*b* show view of the surface structures of the solid portions separated by the fissure and FIG. 23 shows another schematic view of a solid changed by modifications.
Figure 22B:
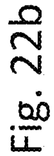
Figure 22A:
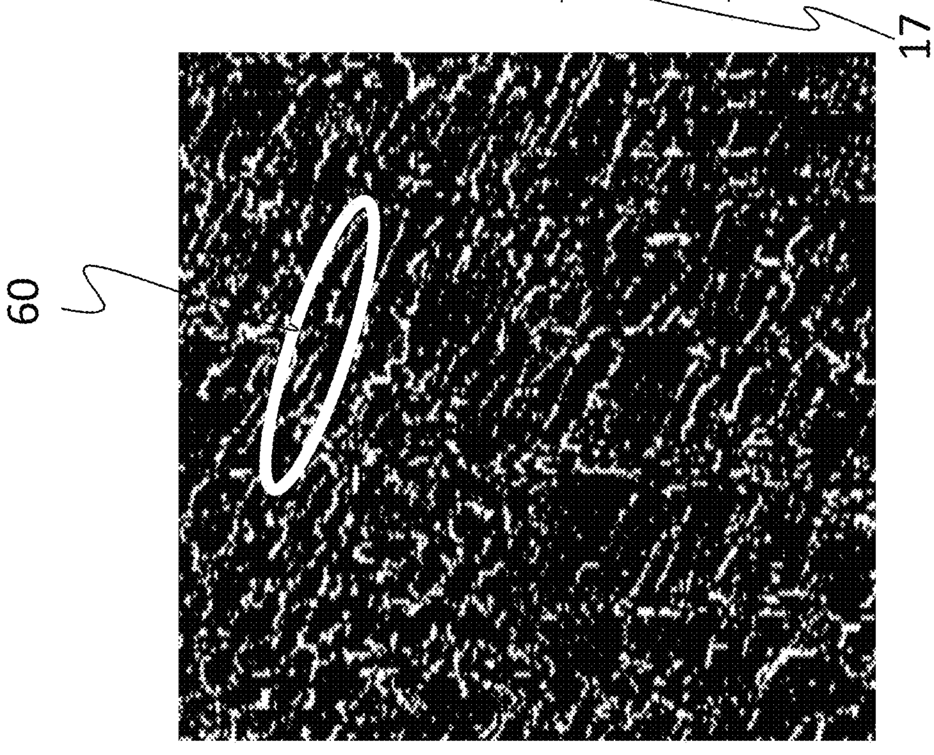

FIGS. 22*a* and 22*b* preferably show two views of a 6H-SiC line defect parameter field 1C, wherein preferably laser damage of 1 $cm^2$ and having a thickness of 120+/−3 μm is present. The two surface structures shown have been formed by separation of the solid 1 into two parts. The reference number 60 here characterizes fissures extending in or substantially in the horizontal direction. In addition to the fissure tracks 60 FIG. 22*a* also shows laser damage. The surface shown in FIG. 22*b* is significantly more homogeneous or has less damage and/or fissures compared to the surface shown in FIG. 22*a*. The detachment zone 2 produced off-centre to the centre Z of the modifications thus enables the creation of differently structured surfaces. The reference number 17 characterizes a reference length which is preferably 1000 μm.

Figure 23:
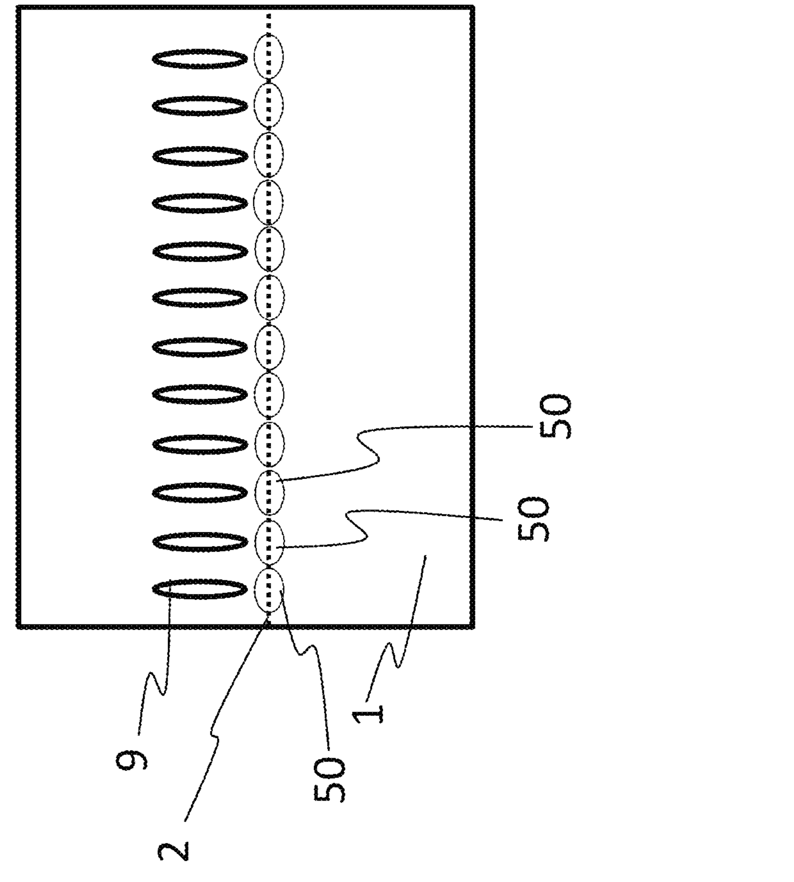

FIG. 23 shows schematically that the crystal lattice of the solid 1 has been changed by the introduction of production of modifications 9 in such a manner that fissure guiding stresses 50 are produced, preferably at a distance from the centre Z of the modification(s) 9. Thus, fissure guiding stresses 50 are produced in the crystal lattice by the modifications 9 in respectively at least one solid region surrounding a modification 9 so that a fissure separating the solid 1 is guided by the fissure guiding stresses 50 in particular offset with respect to the centre Z of the respective modifications 9.

The fissure guiding stresses 50 shown as oval predefine a detachment zone 2 according to the invention along which and through which a fissure produced as a result of mechanical stresses is guided. The mechanical stresses are preferably produced or introduced into the solid 1 by means of the temperature control of a layer arranged or produced on the solid 1.

Thus, the present invention relates to a method for separating at least one solid portion from a solid, in particular a wafer. The method comprises at least the steps: modifying the crystal lattice of the solid by means of a laser, in particular a pico- or femtosecond laser, wherein a plurality of modifications are produced in the crystal lattice, wherein the crystal lattice fissures as a result of the modifications in the regions surrounding the modifications at least in respectively one portion, wherein a detachment zone or a plurality of partial detachment zones is/are predefined by the fissures in the region of the modifications. Additionally, in particular in combination or alternatively the method can comprise the step of providing a solid 1 to be processed, wherein the solid 1 preferably consists of a chemical compound. Furthermore additionally or alternatively, a laser light source can be provided in particular as a modifying device. Furthermore, preferably additionally laser radiation from the laser light source is applied to the solid 1, wherein the laser radiation temperature controls in a defined manner a predefined portion of the solid 1 inside the solid 1 to form a detachment zone 2, wherein the temperature produced in the predefined portion of the solid 1 is so high that the material forming the predefined portion undergoes a predetermined material conversion. The detachment of the solid layer from the solid can therefore merely result from the modifications produced according to the invention. Preferably the modifications 9 are produced as predetermined material conversion of the material forming the predefined portion, wherein such a high temperature is produced by the laser radiation, in particular more than 200 °C or more than 500 °C or more than 800 °C or more than 1000 °C or more than 1500 °C or more than 2000 °C that material conversion is brought about.

Alternatively however it is feasible that the modifications are produced in such a manner that they do not allow a separation of the solid layer from the solid without a further externally initiated impulse.

Thus, after the modifications have been produced, a receiving layer can preferably be arranged on the solid to hold the solid portion and then a thermal action on the receiving layer can take place to produce, in particular mechanically, stresses in the solid, wherein as a result of the stresses, a fissure, in particular a main fissure propagates in the solid along the detachment zone by means of which the solid layer is separated from the solid, preferably at least the majority of the possibly previously produced partial fissures are joined together in the regions of the modifications by the fissure.

Therefore a method for producing a detachment zone in a solid for detaching a solid portion, in particular a solid layer, from the solid is described, wherein the solid portion to be detached is thinner than the solid reduced by the solid portion, at least comprising the steps: providing a solid to be processed, wherein the solid preferably consists of a chemical compound; providing a laser light source; irradiating the solid with laser radiation from the laser light source, wherein the laser radiation penetrates into the solid via a surface of the solid portion to be separated, wherein the laser radiation acts on a predefined portion of the solid inside the solid in a defined manner to form a detachment zone or a plurality of partial detachment zones, characterized in that as a result of the laser action, a plurality of modifications are successively produced in the crystal lattice of the solid, wherein as a result of the modifications the crystal lattice fissures in the regions surrounding the modifications at least in a portion thereof, wherein as a result of the fissures in the region of the modifications, the detachment zone is predefined or a plurality of partial detachment zones are predefined.

A method for separating at least one solid portion from a solid, in particular a wafer is further described, at least comprising the steps: modifying the crystal lattice of the solid by means of a modifying agent, in particular a laser, in particular a pico- or femtosecond laser, wherein several modifications are produced in the crystal lattice, wherein as a result of the modifications the crystal lattice fissures in the regions surrounding the modifications at least in a portion thereof, wherein as a result of the fissures in the region of the modifications the detachment zone is predefined, arranging a receiving layer on the solid to hold the solid portion, thermally acting on the receiving layer to produce stresses, in particular mechanically, in the solid, wherein as a result of the stresses a main fissure propagates in the solid along the detachment zone which interconnects at least the majority of the fissures in the region of the modifications.

REFERENCE LIST

1 Solid
2 Detachment zone
4 Laser beam
5 Polished surface
6 Laser beam in solid
7 Underside of solid
8 Focus
9 Modification
10 First solid portion
11 Solid layer
12 Second solid portion
13 Fissure
14 Location of start of processing
15 Centre of modifications
17 Reference length
18 Main surface
25 First fissure portion
27 Second fissure portion
28 Third fissure portion
29 Fourth fissure portion
30 Rotary table
31 Fissure between outer edge and first modification block
32 Fissure between two modification blocks
33 Fissure between modification block and further modification block or outer edge
34 Fissure between modification block and outer edge
40 Optical system
41 First region without modification block
42 Second region without modification block
43 Third region without modification block
44 Fourth region without modification block
45 Fifth region without modification block
51 Unchanged material
52 Changed material
53 Raman spectrum
54 Intensity in %
56 Wavelength in $cm^{-1}$
61 Graph for unchanged material portion
62 Graph for changed material portion
65 First aligning element
66 Second aligning element
67 Third aligning element
68 Fourth aligning element
69 Sensor means
75 Data carrier element and/or data transfer element
76 Groove
77 Fluid inlet
78 Fluid line
79 Fluid outlet
80 Guide-support structure
71 First end of a fissure portion
72 Second end of a fissure portion
91 First block of modifications
92 Second block of modifications
112 Second solid layer
113 Third solid layer
140 Receiving layer
150 Temperature control fluid
161 Deformation direction of receiving layer
300 Coupling layer
630 Laser beam waist
632 Laser beam waist
400 Scanner
401 Laser beam source
402 Laser beam conductor
403 Further laser beam conductor
501 Exposed surface of first solid layer
502 Laser penetration surface of second solid layer
503 Exposed surface of second solid layer
504 Laser penetration surface of third solid layer
505 Exposed surface of third solid layer
606 Light beam
608 Optical system
610 First deflecting element
612 Second deflecting element
613 Third deflecting element
616 First light beam component
618 Second light beam component
620 Focus
622 First surface portion
624 Second surface portion
630 Light beam waist
632 Light beam waist
901 First field without modifications
902 Second field without modifications
903 Third field without modifications

What is claimed is:

1. A method for producing a detachment region in a solid-state body, the method comprising:

providing a solid body that consists of a chemical compound, the chemical compound comprising a combination of elements selected from the group consisting of the 3rd, 4th and 5th main groups and subgroup 12 of the Periodic Table of the Elements;

providing a laser light source; and exposing the solid body to laser beams from the laser light source, wherein the laser beams penetrate into the solid body via a main surface of the solid body, wherein the laser beams are applied in a defined manner on a predefined portion of the solid body within the solid body to form a detachment region, wherein the application of the laser beams successively creates multiple modifications in a crystal lattice of the solid body;

wherein the crystal lattice, as a result of the modifications, fissures in a subcritical manner at least in a portion in each case in regions that surround the modifications, wherein the subcritical fissures propagate mainly in a plane which is parallel or in a defined alignment and essentially parallel with respect to the main surface, wherein the subcritical fissures in the region of the modifications define the detachment region or multiple partial detachment regions, wherein the subcritical fissures join to form a main fissure, and wherein the main fissure separates a solid layer from the solid body.

2. The method of claim 1, wherein the modifications are created as a predetermined conversion of matter of the material that forms the predefined portion, wherein the laser beams generate a temperature high enough to bring about a conversion of matter.

3. The method of claim 1, wherein the solid layer is thinner than the solid body reduced by the solid layer.

4. The method of claim 1, wherein the laser beams penetrate into the solid body through a planar main surface of the solid body, and wherein the detachment region extends parallel to the planar main surface.

5. The method of claim 1, wherein the main surface is a surface of the solid layer to be separated from the solid body.

6. The method of claim 1, wherein the solid body is an ingot or a wafer.

7. The method of claim 1, wherein the chemical compound is silicon carbide.

8. The method of claim 1, wherein the portion of the solid body in which modifications are formed undergoes a conversion of matter and/or a conversion of phase as a result of the laser application.

9. The method of claim 8, wherein the conversion of matter comprises breakdown of the chemical compound into several or all of its individual constituents and/or elements.

10. The method of claim 9, wherein the chemical compound is SiC, and wherein the conversion of matter results in Si (silicon) and DLC (diamond-like carbon) phases.

* * * * *